US012787599B2

(12) United States Patent
Ishida

(10) Patent No.: US 12,787,599 B2
(45) Date of Patent: Nov. 3, 2026

(54) DISPLAY DEVICE AND MANUFACTURING METHOD THEREOF

(71) Applicant: Magnolia White Corporation, Tokyo (JP)

(72) Inventor: Arichika Ishida, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 304 days.

(21) Appl. No.: 18/490,761

(22) Filed: Oct. 20, 2023

(65) Prior Publication Data

US 2024/0147810 A1 May 2, 2024

(30) Foreign Application Priority Data

Oct. 27, 2022 (JP) ................................ 2022-172452

(51) Int. Cl.
*H10K 59/80* (2023.01)
*H10K 71/20* (2023.01)
(Continued)

(52) U.S. Cl.
CPC ..... *H10K 59/80517* (2023.02); *H10K 71/211* (2023.02); *H10K 71/60* (2023.02); *H10K 2102/102* (2023.02); *H10K 2102/103* (2023.02)

(58) Field of Classification Search
CPC ........... H10K 59/80517; H10K 71/211; H10K 71/60; H10K 2102/102; H10K 2102/103; H10K 59/1201; H10K 59/131; H10K 59/805; H10K 59/122; H10K 59/8051; H10K 50/81; H10K 50/816; H10K 59/12; H10K 59/80; G09F 9/335
See application file for complete search history.

(56) References Cited

U.S. PATENT DOCUMENTS

2004/0160170 A1 8/2004 Sato et al.
2009/0009069 A1 1/2009 Takata
(Continued)

FOREIGN PATENT DOCUMENTS

JP 2000-195677 A 7/2000
JP 2004-207217 A 7/2004
(Continued)

OTHER PUBLICATIONS

Office Action issued Aug. 18, 2026, in JP Application No. 2022-172452, 8pp.

*Primary Examiner* — Elmito Breval
(74) *Attorney, Agent, or Firm* — XSENSUS LLP

(57) ABSTRACT

According to one embodiment, a display device includes a connection electrode, a terminal electrode, an insulating layer including a contact hole, a lower electrode electrically connected to the connection electrode in the contact hole, a rib, a partition including a lower portion and an upper portion, an organic layer provided on the lower electrode, an upper electrode covering the organic layer, and a cover electrode covering the terminal electrode exposed from the insulating layer. The lower electrode includes a first transparent electrode, a first metal electrode located on the first transparent electrode, and a second transparent electrode located on the first metal electrode. The cover electrode is formed of a same material as the first transparent electrode.

8 Claims, 37 Drawing Sheets

(51) Int. Cl.

| | |
|---|---|
| ***H10K 71/60*** | (2023.01) |
| *H10K 102/10* | (2023.01) |

(56) References Cited

U.S. PATENT DOCUMENTS

| | | | | |
|---|---|---|---|---|
| 2019/0363275 | A1 | 11/2019 | Ochi et al. | |
| 2020/0227509 | A1 | 7/2020 | Yoon et al. | |
| 2022/0077251 | A1 | 3/2022 | Choung et al. | |
| 2022/0208862 | A1* | 6/2022 | Lee | G06F 3/0446 |

FOREIGN PATENT DOCUMENTS

| | | | |
|---|---|---|---|
| JP | 2008-135325 | A | 6/2008 |
| JP | 2009-032673 | A | 2/2009 |
| JP | 2010-118191 | A | 5/2010 |
| JP | 2012-182121 | A | 9/2012 |
| JP | 2013-54863 | A | 3/2013 |
| JP | 2022-108901 | A | 7/2022 |
| KR | 20160046209 | A | 4/2016 |
| WO | 2018/179308 | A1 | 10/2018 |

* cited by examiner

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-172452, filed Oct. 27, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability is required.

DETAILED DESCRIPTION

Figure 1:
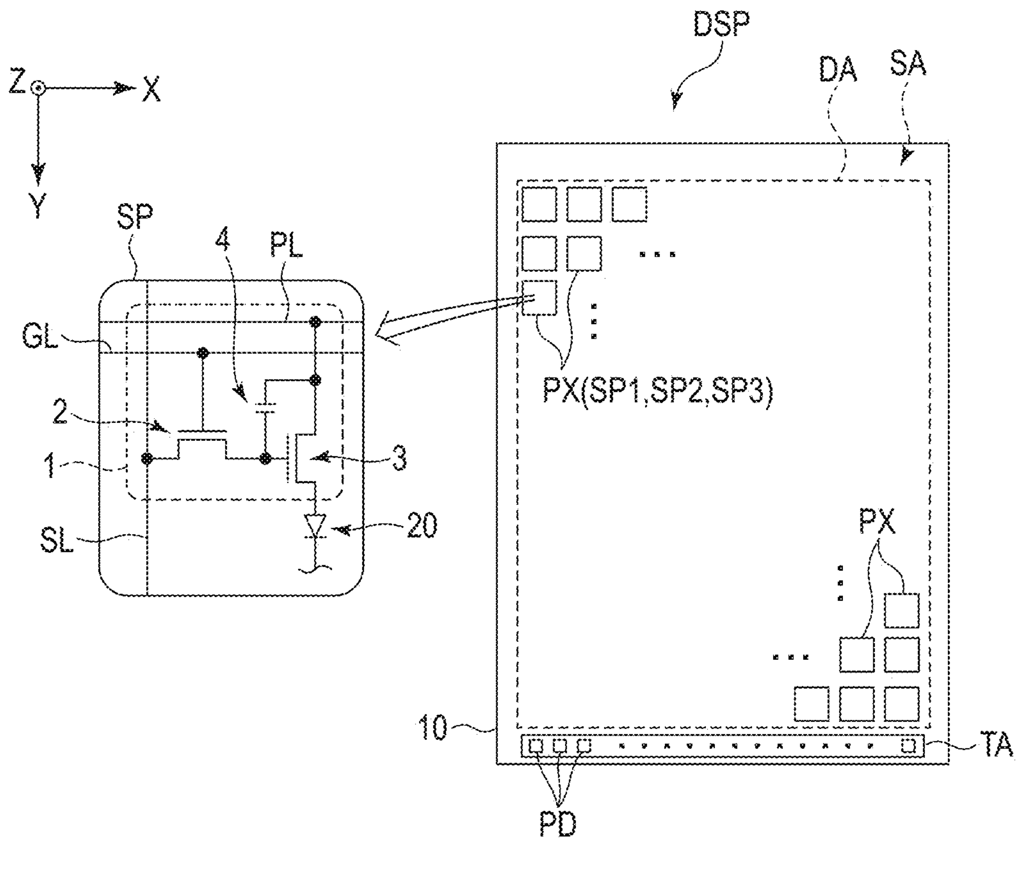
FIG. 1 is a diagram showing a configuration example of a display device DSP.

Embodiments described herein aim to provide a display device and a manufacturing method thereof such that the reduction in reliability can be prevented.

In general, according to one embodiment, a display device comprises a substrate, a connection electrode provided in a display area which displays an image above the substrate, a terminal electrode provided in a surrounding area located on an external side relative to the display area above the substrate, an insulating layer which comprises a contact hole communicating with the connection electrode and overlaps a peripheral portion of the terminal electrode, a lower electrode provided on the insulating layer and electrically connected to the connection electrode in the contact hole, a rib formed of an inorganic insulating material and overlapping a peripheral portion of the lower electrode, a partition which comprises a lower portion provided on the rib and formed of a conductive material and an upper portion provided on the lower portion and protruding from a side surface of the lower portion, an organic layer provided on the lower electrode and including a light emitting layer, an upper electrode which covers the organic layer and is in contact with the lower portion of the partition, and a cover electrode which covers the terminal electrode exposed from the insulating layer. The lower electrode comprises a first transparent electrode, a first metal electrode located on the first transparent electrode, and a second transparent electrode located on the first metal electrode. The cover electrode is formed of a same material as the first transparent electrode.

According to another embodiment, a manufacturing method of a display device comprises forming a connection electrode located in a display area which displays an image, and a terminal electrode located in a surrounding area located on an external side relative to the display area, forming an insulating layer which comprises a contact hole communicating with the connection electrode and overlaps a peripheral portion of the terminal electrode, forming a first metal layer on the first transparent conductive layer after forming the first transparent conductive layer over the display area and the surrounding area, and further forming a second transparent conductive layer on the first metal layer, removing the first metal layer after removing the second transparent conductive layer in the surrounding area, forming a lower electrode electrically connected to the connection electrode in the contact hole by patterning the first transparent conductive layer, the first metal layer and the second transparent conductive layer in the display area, forming a cover electrode which covers the terminal electrode exposed from the insulating layer by patterning the first transparent conductive layer in the surrounding area, forming an inorganic insulating layer over the display area and the surrounding area, forming a partition which comprises a lower portion located on the inorganic insulating layer and formed of a conductive material and an upper portion located on the lower portion and protruding from a side surface of the lower portion in the display area, forming an aperture which overlaps the lower electrode and an aperture which overlaps the cover electrode by patterning the inorganic insulating layer, forming an organic layer including a light emitting layer on the lower electrode, and forming an upper electrode which covers the organic layer and is in contact with the lower portion of the partition.

The embodiments can provide a display device and a manufacturing method thereof such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as "on" or "above".

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA located on an external side relative to the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three elements. The combination may consist of two elements or may consist of four or more elements by adding subpixel SP4, etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

The surrounding area SA comprises a terminal area TA for connecting an IC chip and a flexible printed circuit board. The terminal area TA comprises a plurality of pads (terminals) PD. The pads PD are connected to the terminal of the IC chip and the terminal of the flexible printed circuit.

Figure 2:
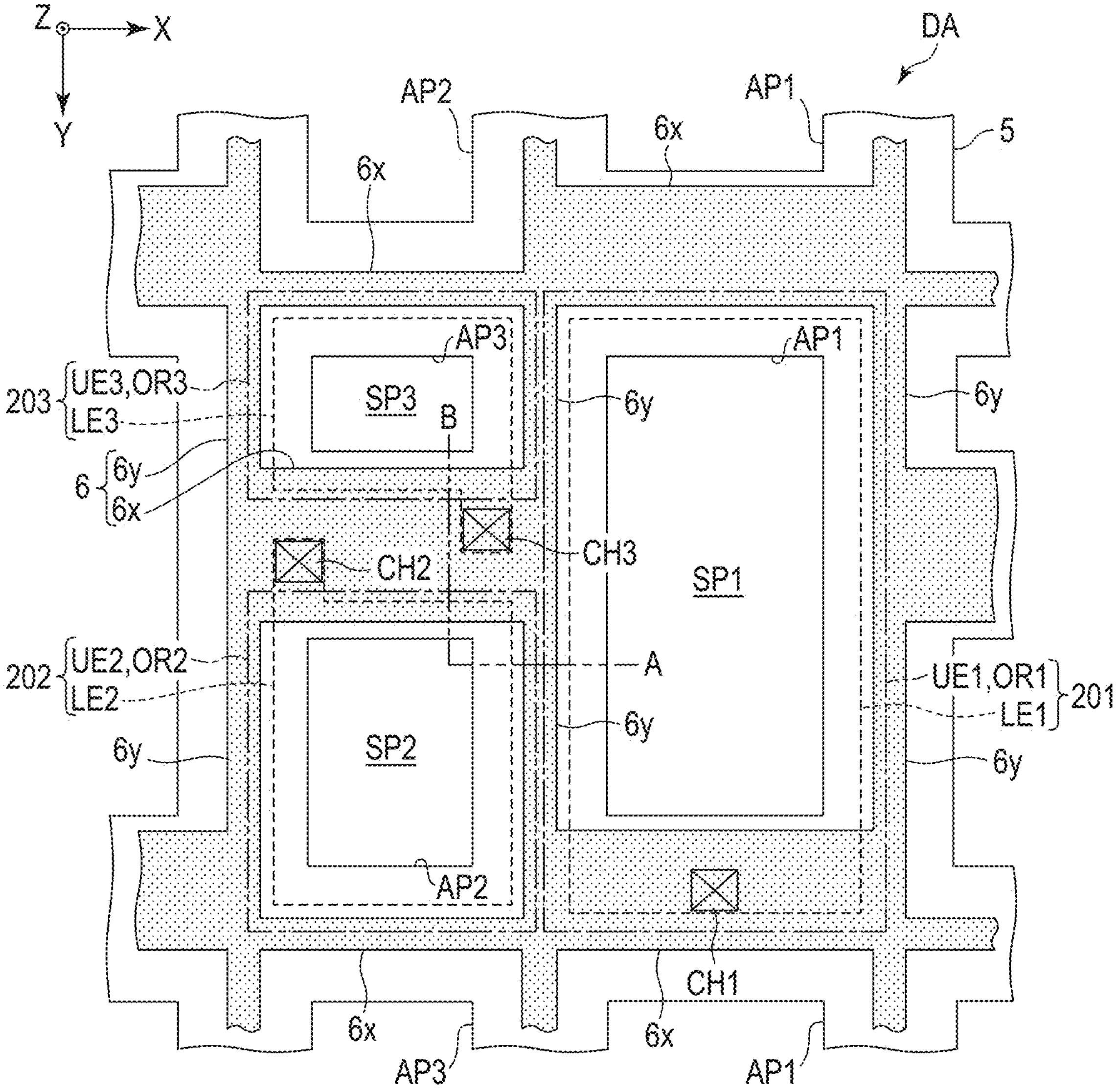
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 is formed into a grating shape surrounding the apertures AP1, AP2 and AP3. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

The display element 201 of subpixel SP1 comprises a lower electrode LE1, an upper electrode UE1 and an organic layer OR1 overlapping the aperture AP1. The organic layer OR1 includes a light emitting layer which emits light in, for example, a blue wavelength range.

The display element 202 of subpixel SP2 comprises a lower electrode LE2, an upper electrode UE2 and an organic layer OR2 overlapping the aperture AP2. The organic layer OR2 includes a light emitting layer which emits light in, for example, a green wavelength range.

The display element 203 of subpixel SP3 comprises a lower electrode LE3, an upper electrode UE3 and an organic layer OR3 overlapping the aperture AP3. The organic layer OR3 includes a light emitting layer which emits light in, for example, a red wavelength range.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. It should be noted that the outer shape of each of the lower electrodes, organic layers and upper electrodes shown in the figure does not necessarily reflect the accurate shape.

The peripheral portion of each of the lower electrodes LE1, LE2 and LE3, the peripheral portion of each of the organic layers OR1, OR2 and OR3 and the peripheral portion of each of the upper electrodes UE1, UE2 and UE3 overlap the rib 5 as seen in plan view.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1, the area of the aperture AP2 and the area of the aperture AP3 are different from each other. The area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

Figure 3:
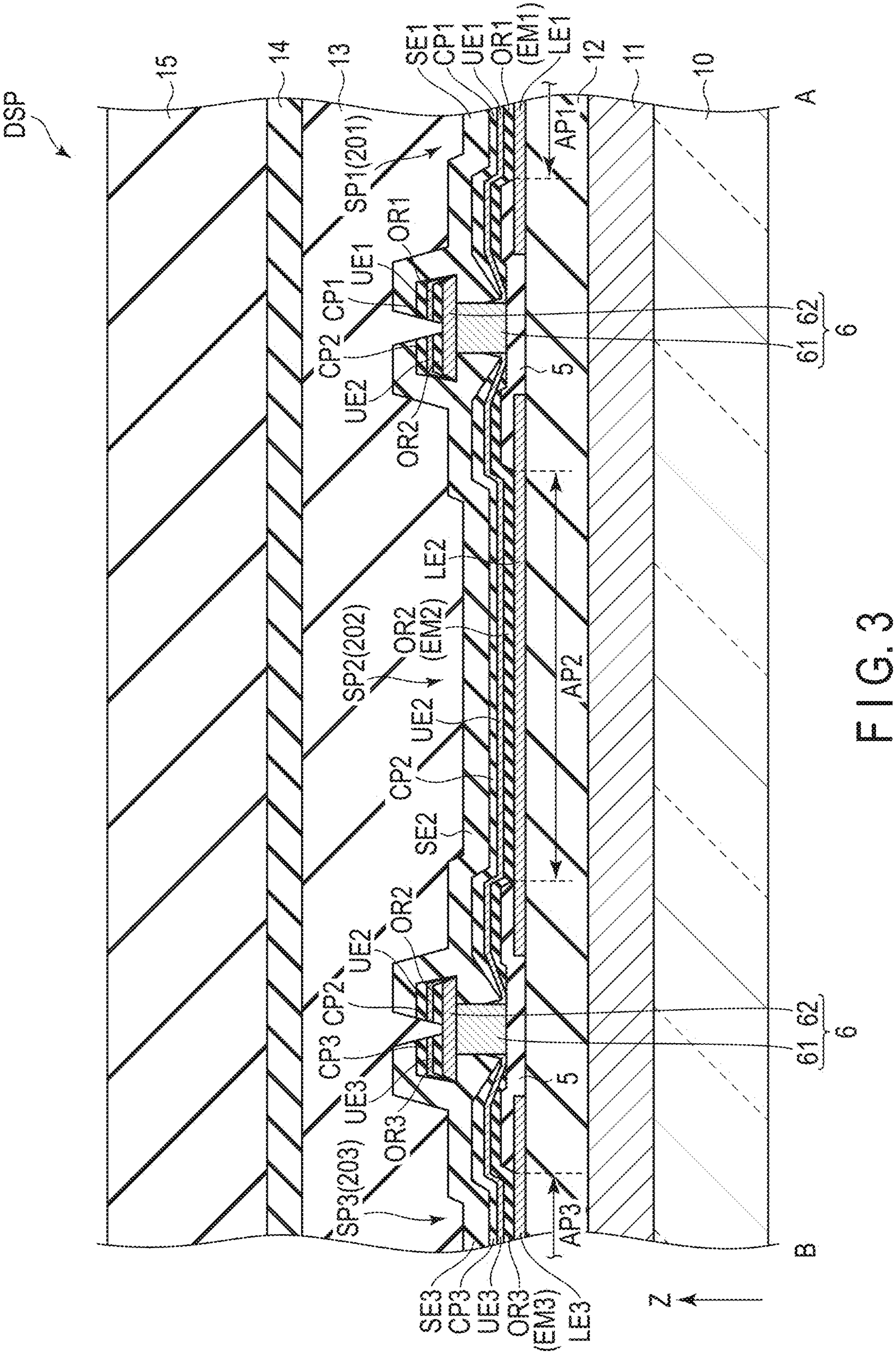
FIG. 3 is a schematic cross-sectional view of the display device DSP along the A-B line of FIG. 2.

FIG. 3 is a schematic cross-sectional view of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11.

The lower electrodes LE1, LE2 and LE3 are provided on the insulating layer 12 and are spaced apart from each other. The rib 5 is provided on the insulating layer 12 and the lower electrodes LE1, LE2 and LE3. The aperture AP1 of the rib 5 overlaps the lower electrode LE1. The aperture AP2 overlaps the lower electrode LE2. The aperture AP3 overlaps the lower electrode LE3. The peripheral portions of the lower electrodes LE1, LE2 and LE3 are covered with the rib 5. Between, of the lower electrodes LE1, LE2 and LE3, the lower electrodes which are adjacent to each other, the insulating layer 12 is covered with the rib 5. The lower electrodes LE1, LE2 and LE3 are connected to the pixel circuits 1 of subpixels SP1, SP2 and SP3, respectively, through the contact holes provided in the insulating layer 12.

The partition 6 includes a conductive lower portion (stem) 61 provided on the rib 5 and an upper portion (shade) 62 provided on the lower portion 61. The lower portion 61 of the partition 6 shown on the right side of the figure is located between the aperture AP1 and the aperture AP2. The lower portion 61 of the partition 6 shown on the left side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 is called an overhang shape.

The organic layer OR1 is in contact with the lower electrode LE1 through the aperture AP1 and covers the lower electrode LE1 exposed from the aperture AP1. The peripheral portion of the organic layer OR1 is located on the rib 5. The upper electrode UE1 covers the organic layer OR1 and is in contact with the lower portion 61.

The organic layer OR2 is in contact with the lower electrode LE2 through the aperture AP2 and covers the lower electrode LE2 exposed from the aperture AP2. The peripheral portion of the organic layer OR2 is located on the rib 5. The upper electrode UE2 covers the organic layer OR2 and is in contact with the lower portion 61.

The organic layer OR3 is in contact with the lower electrode LE3 through the aperture AP3 and covers the lower electrode LE3 exposed from the aperture AP3. The peripheral portion of the organic layer OR3 is located on the rib 5. The upper electrode UE3 covers the organic layer OR3 and is in contact with the lower portion 61.

In the example of FIG. 3, subpixel SP1 comprises a cap layer CP1 and a sealing layer SE1. Subpixel SP2 comprises a cap layer CP2 and a sealing layer SE2. Subpixel SP3 comprises a cap layer CP3 and a sealing layer SE3. The cap layers CP1, CP2 and CP3 function as optical adjustment layers which improve the extraction efficiency of the light emitted from the organic layers OR1, OR2 and OR3, respectively.

The cap layer CP1 is provided on the upper electrode UE1.

The cap layer CP2 is provided on the upper electrode UE2.

The cap layer CP3 is provided on the upper electrode UE3.

The sealing layer SE1 is provided on the cap layer CP1, is in contact with the partition 6 and continuously covers each member of subpixel SP1.

The sealing layer SE2 is provided on the cap layer CP2, is in contact with the partition 6 and continuously covers each member of subpixel SP2.

The sealing layer SE3 is provided on the cap layer CP3, is in contact with the partition 6 and continuously covers each member of subpixel SP3.

In the example of FIG. 3, the organic layer OR1, the upper electrode UE1 and the cap layer CP1 are partly located on the partition 6 around subpixel SP1. These portions are spaced apart from, of the organic layer OR1, the upper electrode UE1 and the cap layer CP1, the portions located in the aperture AP1 (the portions constituting the display element 201).

Similarly, the organic layer OR2, the upper electrode UE2 and the cap layer CP2 are partly located on the partition 6 around subpixel SP2. These portions are spaced apart from, of the organic layer OR2, the upper electrode UE2 and the cap layer CP2, the portions located in the aperture AP2 (the portions constituting the display element 202).

Similarly, the organic layer OR3, the upper electrode UE3 and the cap layer CP3 are partly located on the partition 6 around subpixel SP3. These portions are spaced apart from, of the organic layer OR3, the upper electrode UE3 and the cap layer CP3, the portions located in the aperture AP3 (the portions constituting the display element 203).

The end portions of the sealing layers SE1, SE2 and SE3 are located above the partition 6. In the example of FIG. 3, the end portions of the sealing layers SE1 and SE2 located above the partition 6 between subpixels SP1 and SP2 are spaced apart from each other. The end portions of the sealing layers SE2 and SE3 located above the partition 6 between subpixels SP2 and SP3 are spaced apart from each other.

The sealing layers SE1, SE2 and SE3 are covered with a resin layer 13. The resin layer 13 is covered with a sealing layer 14. The sealing layer 14 is covered with a resin layer 15.

Each of the rib 5, the sealing layers SE1, SE2 and SE3 and the sealing layer 14 is formed of, for example, an inorganic insulating material such as silicon nitride (SiNx). Each of the rib 5, the sealing layers SE1, SE2 and SE3 and the sealing layer 14 may be formed of another inorganic insulating material such as silicon oxide (SiOx), silicon oxynitride (SiON) or aluminum oxide ($Al_2O_3$).

The lower portion 61 of the partition 6 is formed of a conductive material and is electrically connected to the upper electrodes UE1, UE2 and UE3. Both the lower portion 61 and the upper portion 62 of the partition 6 may be formed of a conductive material.

As described in detail later, each of the lower electrodes LE1, LE2 and LE3 is a multilayer body comprising transparent electrodes and a metal electrode.

Each of the organic layers OR1, OR2 and OR3 includes a plurality of functional layers such as a hole injection layer, a hole transport layer, an electron blocking layer, a hole blocking layer, an electron transport layer and an electron injection layer.

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the upper electrodes UE1, UE2 and UE3 is formed of, for example, a metal material such as an alloy of magnesium and silver (MgAg).

Each of the cap layers CP1, CP2 and CP3 is a multilayer body consisting of a plurality of thin films. All of the thin films are transparent and have refractive indices different from each other.

Configuration Example 1

Figure 4:
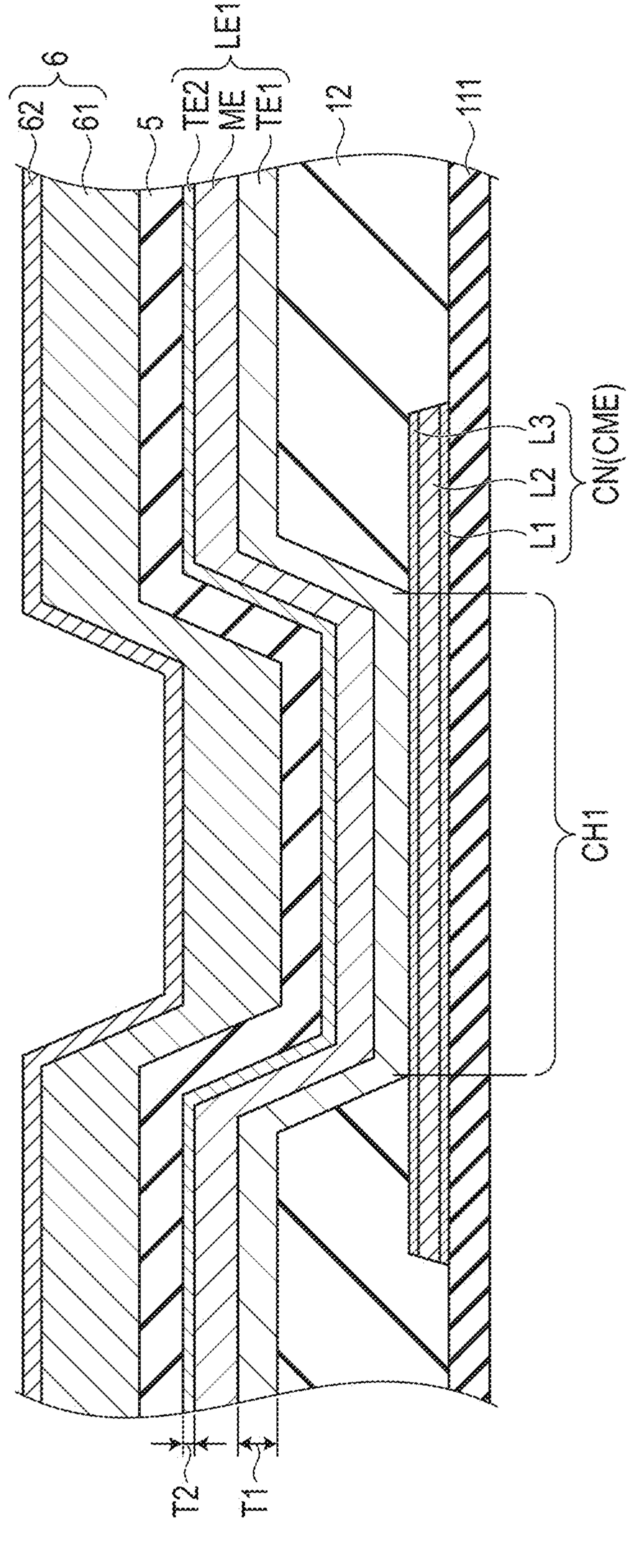
FIG. 4 is a cross-sectional view of configuration example 1 including the contact hole CH1 shown in FIG. 2.

FIG. 4 is a cross-sectional view of configuration example 1 including the contact hole CH1 shown in FIG. 2. In FIG. 4, the illustration of the layers located on the upper side of the partition 6 is omitted.

An insulating layer 111 and a connection electrode CN are included in the circuit layer 11 shown in FIG. 3. The insulating layer 111 is, for example, an inorganic insulating layer. The insulating layer 111 is covered with the insulating layer 12. The illustration of the layers located on the lower side of the insulating layer 111 is omitted.

The connection electrode CN is a metal electrode CME located on the insulating layer 111 and is a multilayer body comprising a plurality of thin films formed of metal materials different from each other. For example, the connection electrode CN comprises a titanium-based thin film L1, an aluminum-based thin film L2 located on the thin film L1 and a titanium-based thin film L3 located on the thin film L2. This connection electrode CN is electrically connected to the drive transistor 3 shown in FIG. 1. The peripheral portion of the connection electrode CN is covered with the insulating layer 12. The contact hole CH1 formed in the insulating layer 12 communicates with the connection electrode CN.

The lower electrode LE1 is provided on the insulating layer 12 and is electrically connected to the connection electrode CN in the contact hole CH1. Thus, the lower electrode LE1 is electrically connected to the drive transistor 3 via the connection electrode CN.

The lower electrode LE1 comprises a transparent electrode TE1, a metal electrode ME located on the transparent electrode TE1 and a transparent electrode TE2 located on the metal electrode ME. The transparent electrode TE1 of the lower electrode LE1 is in contact with the thin film L3 of the connection electrode CN in the contact hole CH1. Each of the transparent electrodes TE1 and TE2 is formed of a transparent conductive oxide such as indium tin oxide (ITO). The metal electrode ME is formed of a metal material such as silver (Ag).

Thickness T1 of the transparent electrode TE1 is greater than thickness T2 of the transparent electrode TE2 (T1>T2).

The rib 5 and the lower and upper portions 61 and 62 of the partition 6 overlap the lower electrode LE1 in the contact hole CH1. The transparent electrode TE2 is in contact with the organic layer OR1 in the aperture AP1 of the rib 5 shown in FIG. 3.

Here, this specification explains the connection structure between the connection electrode CN and the lower electrode LE1 in the contact hole CH1. In configuration example 1, the connection structure between a connection electrode and the lower electrode LE2 in the contact hole CH2 and the connection structure between a connection electrode and the lower electrode LE3 in the contact hole CH3 are similar to the connection structure shown in FIG. 4.

Figure 5:
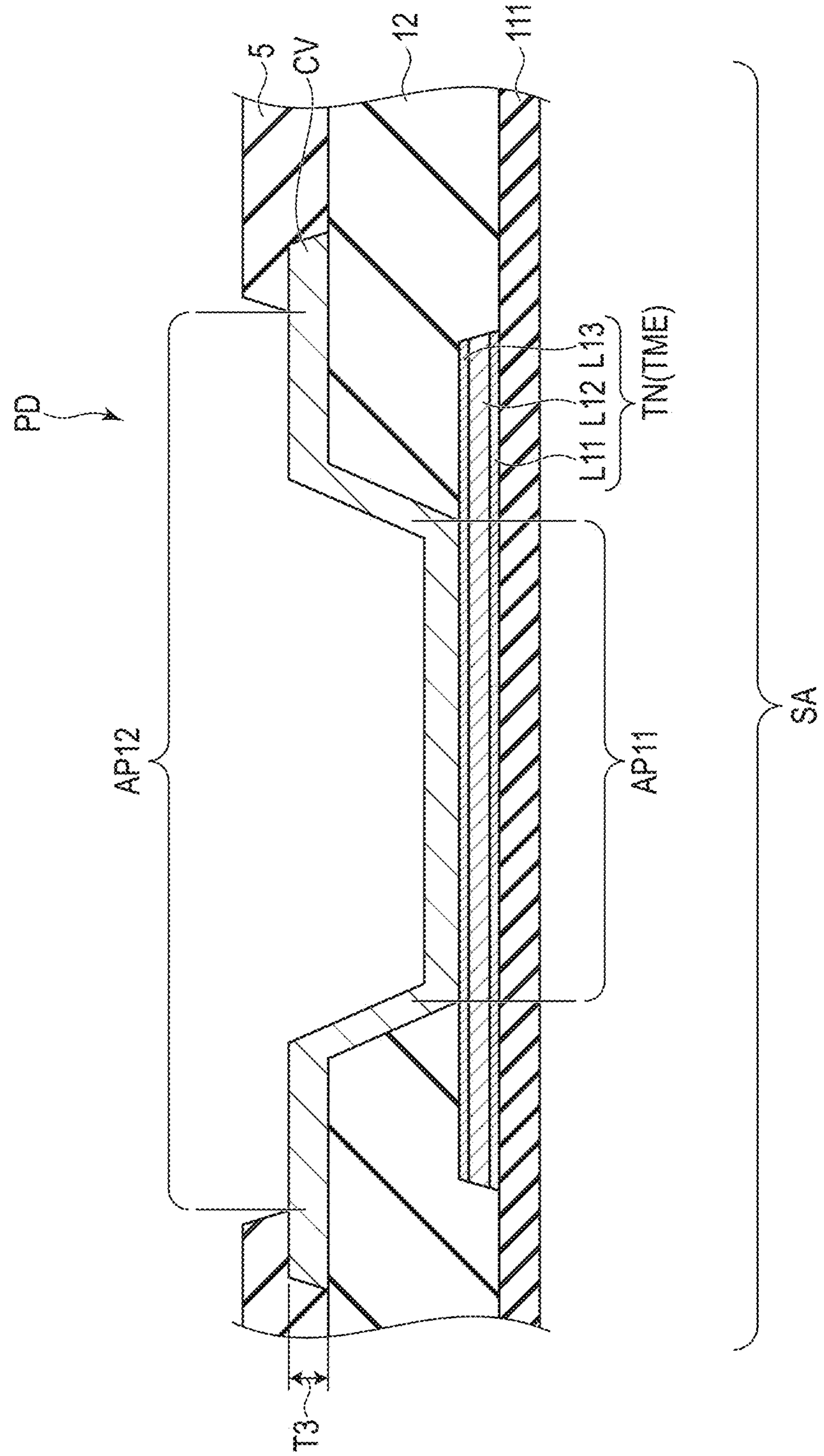
FIG. 5 is a cross-sectional view of configuration example 1 of the pad PD shown in FIG. 1.

FIG. 5 is a cross-sectional view of configuration example 1 of the pad PD shown in FIG. 1. The illustration of the layers located on the lower side of the insulating layer 111 is omitted.

The insulating layer 111 and the insulating layer 12 extend to the surrounding area SA in which the pad PD is provided. The pad PD comprises a terminal electrode TN and a cover electrode CV.

The terminal electrode TN is a metal electrode TME located on the insulating layer 111 and is a multilayer body comprising a plurality of thin films formed of metal materials different from each other. In the example shown here, the terminal electrode TN is formed of the same material as the connection electrode CN shown in FIG. 4 and is formed of a material different from that of the metal electrode ME. In other words, the terminal electrode TN comprises a titanium-based thin film L11, an aluminum-based thin film L12 located on the thin film L11 and a titanium-based thin film L13 located on the thin film L12. The peripheral portion of this terminal electrode TN is covered with the insulating layer 12. The insulating layer 12 comprises an aperture AP11 from which the terminal electrode TN is exposed.

The cover electrode CV is provided on the insulating layer 12, is in contact with the terminal electrode TN exposed from the insulating layer 12 at the aperture AP11 and covers the terminal electrode TN. The cover electrode CV is formed of the same material as the transparent electrode TE1 of the lower electrode LE1 shown in FIG. 4. Thus, the cover electrode CV is a transparent electrode and is formed of a transparent conductive oxide such as ITO.

Thickness T3 of the cover electrode CV is equal to thickness T1 of the transparent electrode TE1 shown in FIG. 4 and is greater than thickness T2 of the transparent electrode TE2 (T3=T1>T2).

The rib 5 comprises an aperture AP12 from which the cover electrode CV is exposed.

Now, this specification explains the manufacturing method of the display device in configuration example 1.

Figure 6:
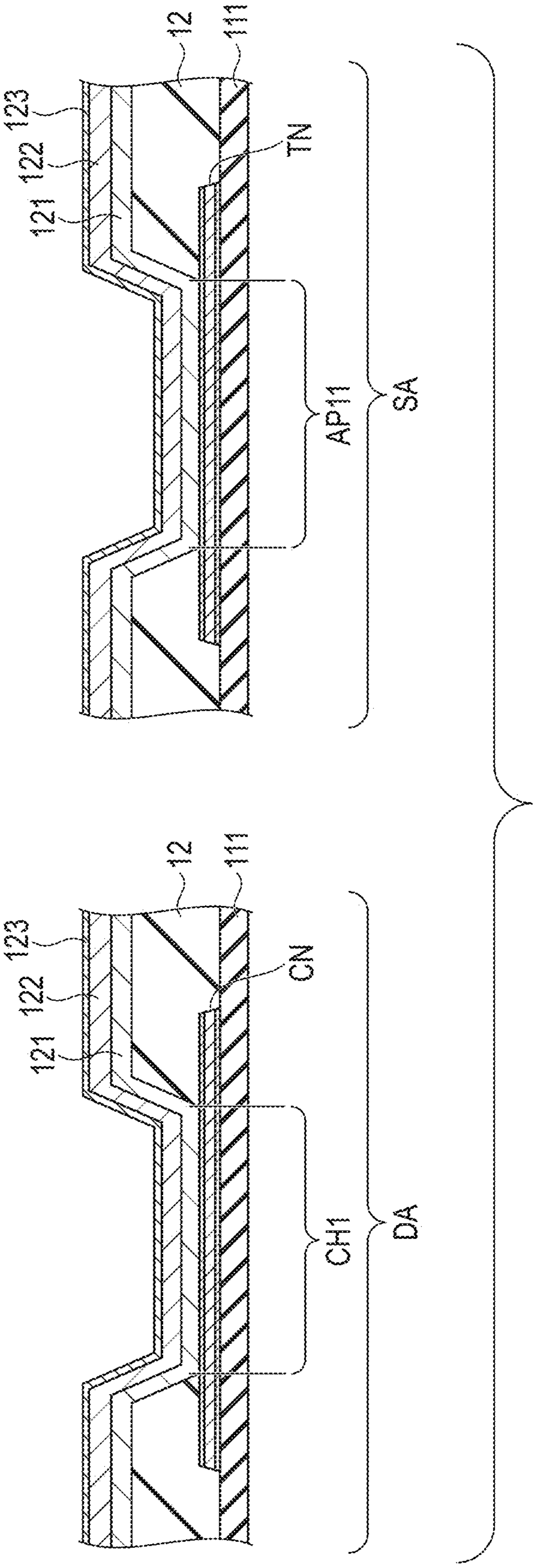
FIG. 6 is a diagram for explaining the manufacturing method of the display device DSP.

First, in step ST1, as shown in FIG. 6, the connection electrode CN located on the insulating layer 111 is formed in the display area DA, and the terminal electrode TN located on the insulating layer 111 is formed in the surrounding area SA. In the process of forming the connection electrode CN and the terminal electrode TN, first, a titanium-based metal layer is formed on the insulating layer 111. Subsequently, an aluminum-based metal layer is formed. Further, a titanium-based metal layer is formed. These titanium-based metal layer, aluminum-based metal layer and titanium-based metal layer correspond to a second metal layer.

Subsequently, a resist having a predetermined shape is formed. The metal layers exposed from the resist are removed by etching using the resist as a mask. By this process, the connection electrode CN and the terminal electrode TN are formed.

Subsequently, the insulating layer 12 is formed. The insulating layer 12 comprises the contact hole CH1 communicating with the connection electrode CN, etc., in the display area DA and is formed so as to overlap the peripheral portion of the terminal electrode TN in the surrounding area SA. In the aperture AP11 of the insulating layer 12, the terminal electrode TN is exposed.

Subsequently, a first transparent conductive layer 121 is formed over the display area DA and the surrounding area SA. Subsequently, a first metal layer 122 is formed on the first transparent conductive layer 121. Further, a second transparent conductive layer 123 is formed on the first metal layer 122. The first transparent conductive layer 121 is in contact with the connection electrode CN in the contact hole CH1 of the display area DA and is in contact with the terminal electrode TN in the aperture AP11 of the surrounding area SA. For example, the first transparent conductive layer 121 and the second transparent conductive layer 123 are formed of ITO, and the first metal layer 122 is formed of silver. The first transparent conductive layer 121 is formed so as to be thicker than the second transparent conductive layer 123.

Figure 7:
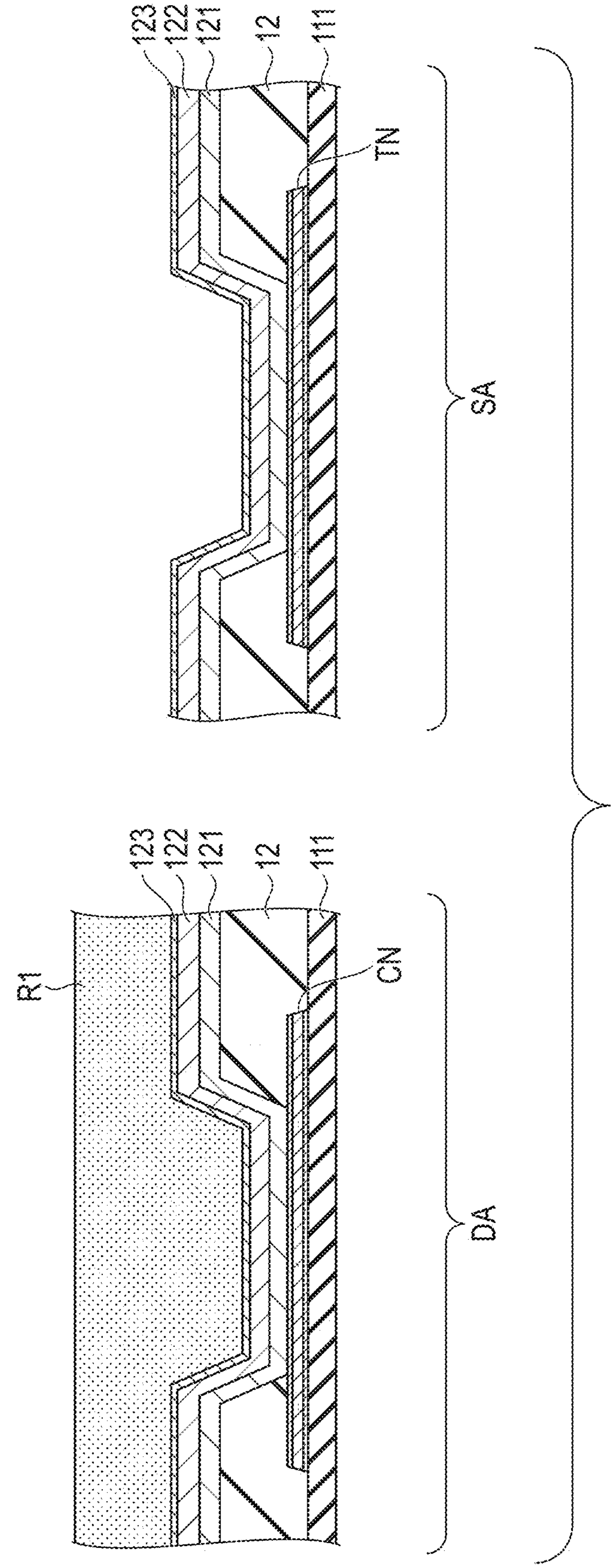
FIG. 7 is a diagram for explaining the manufacturing method of the display device DSP.

Subsequently, in step ST2, as shown in FIG. 7, a resist R1 which covers the second transparent conductive layer 123 is formed over the display area DA. The second transparent conductive layer 123 is exposed from the resist R1 in at least the area forming the pads PD in the surrounding area SA.

Figure 8:
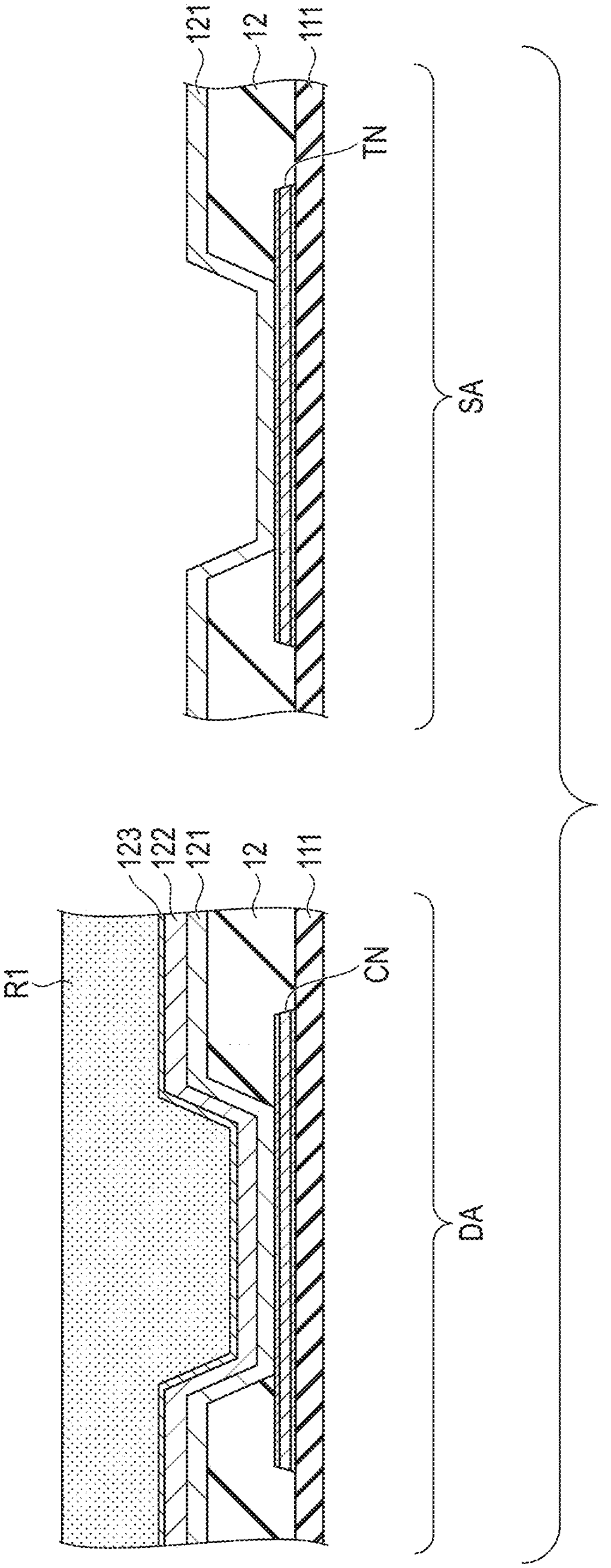
FIG. 8 is a diagram for explaining the manufacturing method of the display device DSP.

Subsequently, in step ST3, as shown in FIG. 8, the second transparent conductive layer 123 exposed from the resist R1 in the surrounding area SA is removed by etching using the resist R1 as a mask. Subsequently, the first metal layer 122 of the surrounding area SA is further removed. By this process, the first transparent conductive layer 121 is exposed in the surrounding area SA.

Figure 9:
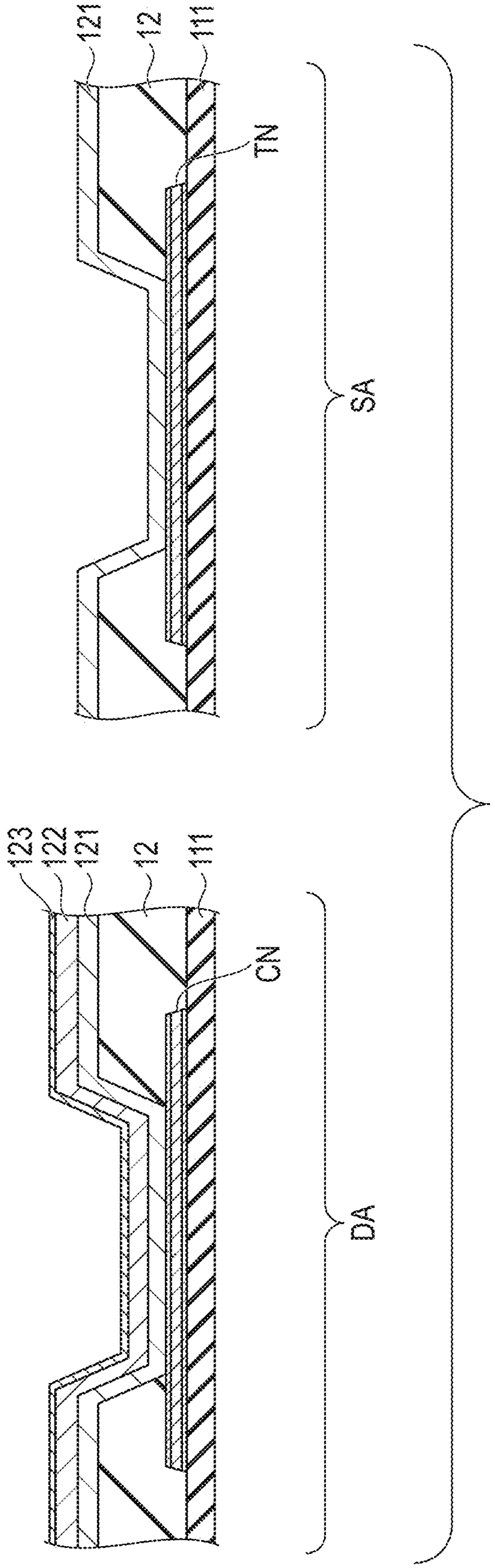
FIG. 9 is a diagram for explaining the manufacturing method of the display device DSP.

Subsequently, in step ST4, as shown in FIG. 9, the resist R1 is removed. By this process, the second transparent conductive layer 123 is exposed in the display area DA.

Figure 10:
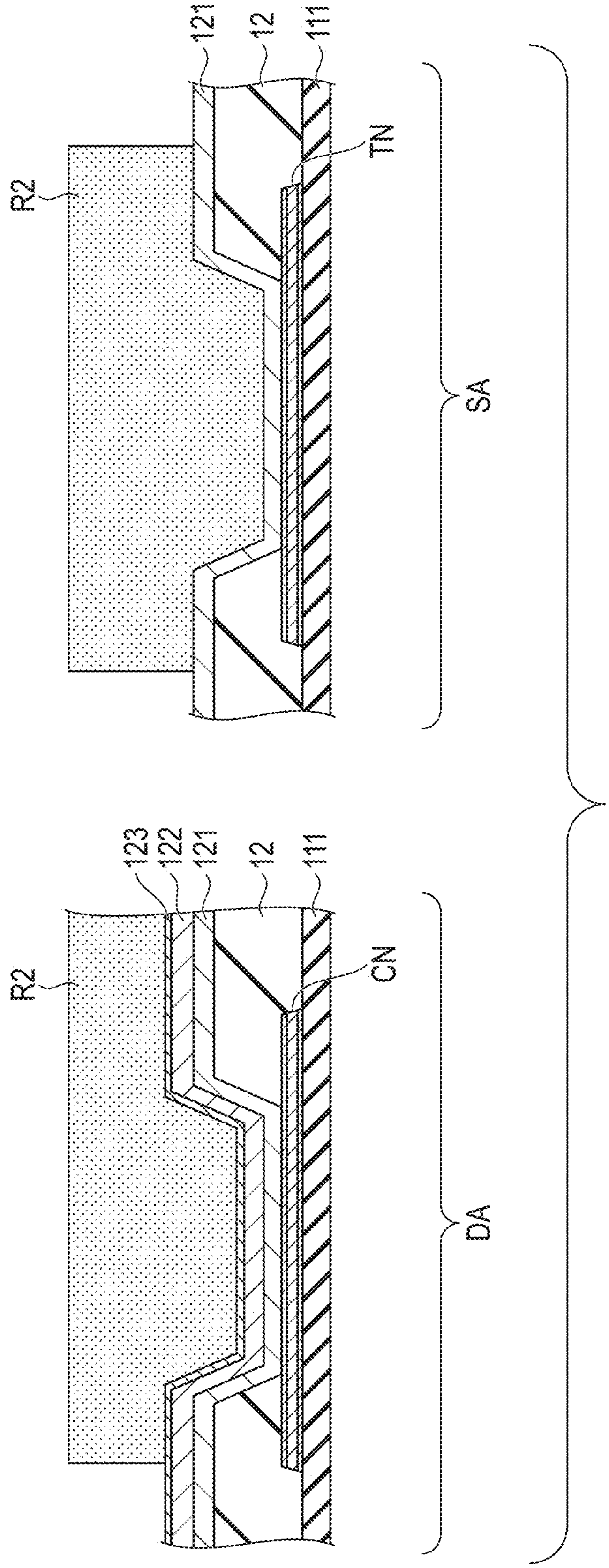
FIG. 10 is a diagram for explaining the manufacturing method of the display device DSP.

Subsequently, in step ST5, as shown in FIG. 10, a resist R2 having a predetermined shape is formed in the display area DA and the surrounding area SA. The resist R2 is formed so as to correspond to the shapes of the lower electrodes LE1, LE2 and LE3 and the cover electrode CV.

Figure 11:
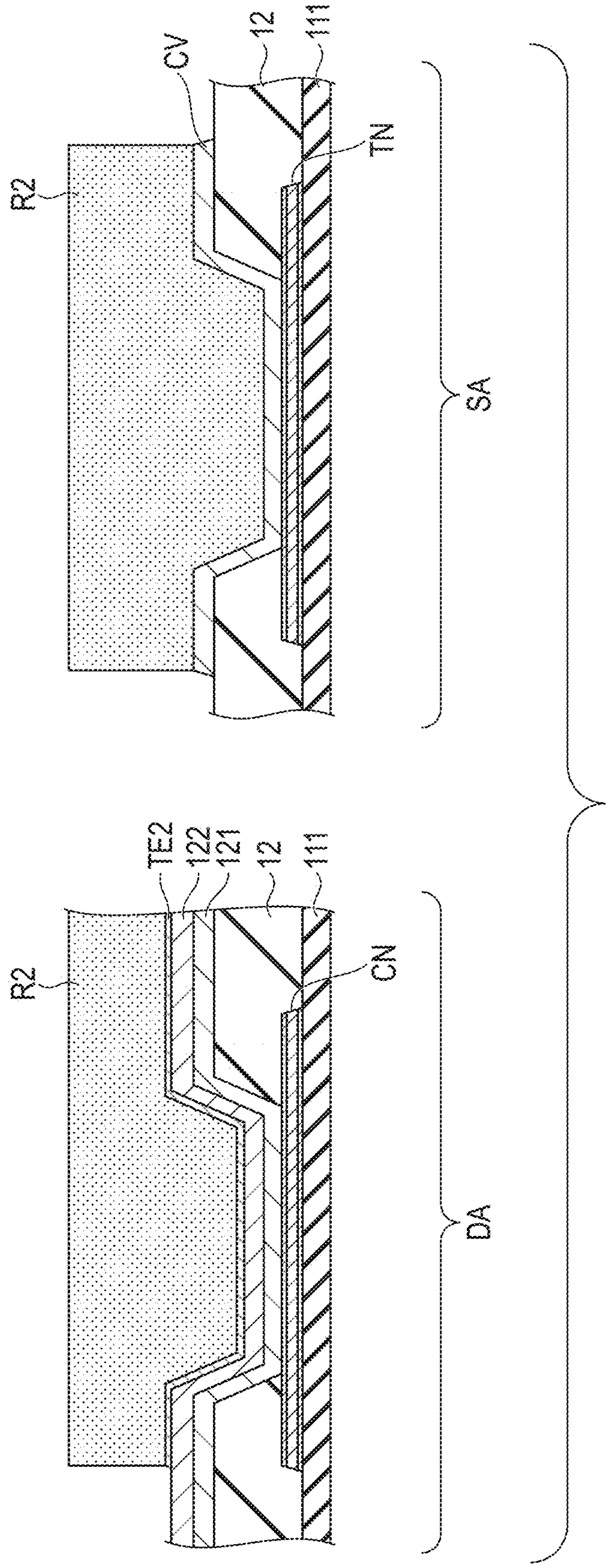
FIG. 11 is a diagram for explaining the manufacturing method of the display device DSP.

Subsequently, in step ST6, as shown in FIG. 11, by etching using the resist R2 as a mask, the second transparent conductive layer 123 exposed from the resist R2 in the display area DA is removed, and the first transparent conductive layer 121 exposed from the resist R2 in the surrounding area SA is removed. By this process, in the display area DA, the transparent electrode TE2 is formed, and the first metal layer 122 is exposed. Further, in the surrounding area SA, the cover electrode CV is formed, and the insulating layer 12 around the cover electrode CV is exposed.

Figure 12:
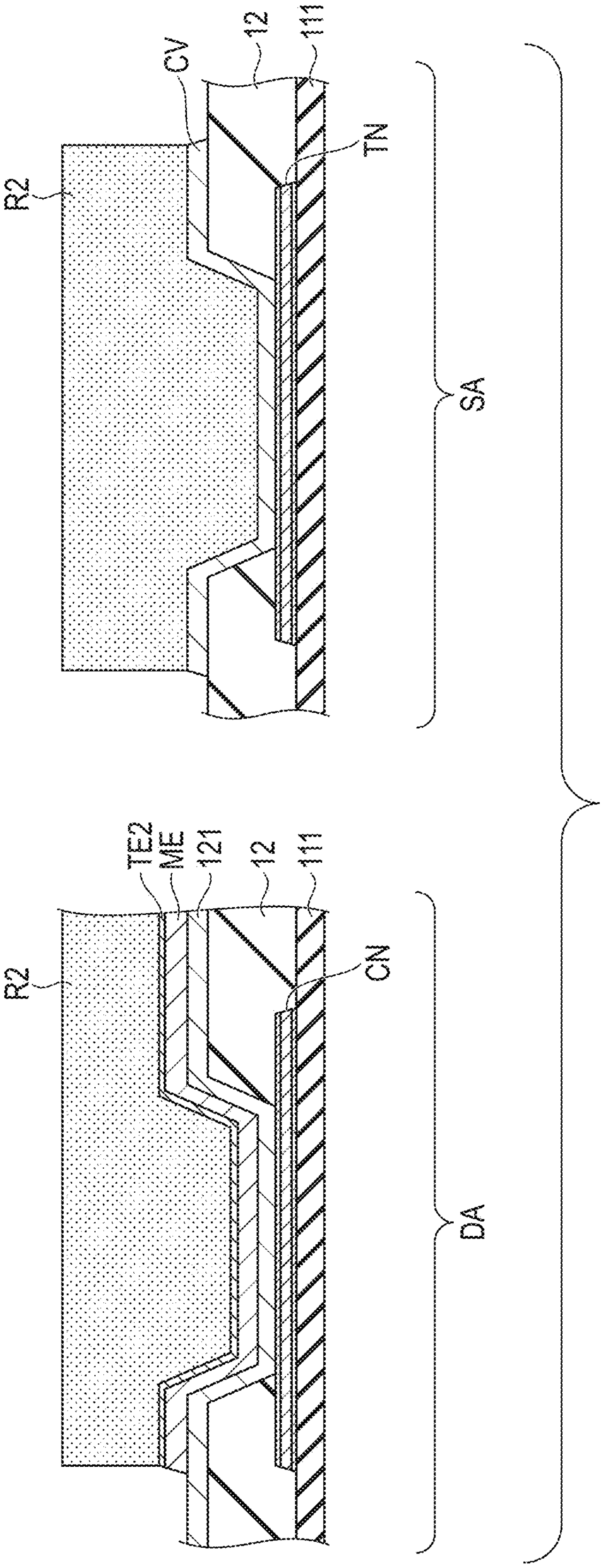
FIG. 12 is a diagram for explaining the manufacturing method of the display device DSP.

Subsequently, in step ST7, as shown in FIG. 12, the first metal layer 122 exposed from the resist R2 in the display area DA is removed by etching using the resist R2 as a mask. By this process, in the display area DA, the metal electrode ME is formed immediately under the transparent electrode TE2, and the first transparent conductive layer 121 is exposed.

Figure 13:
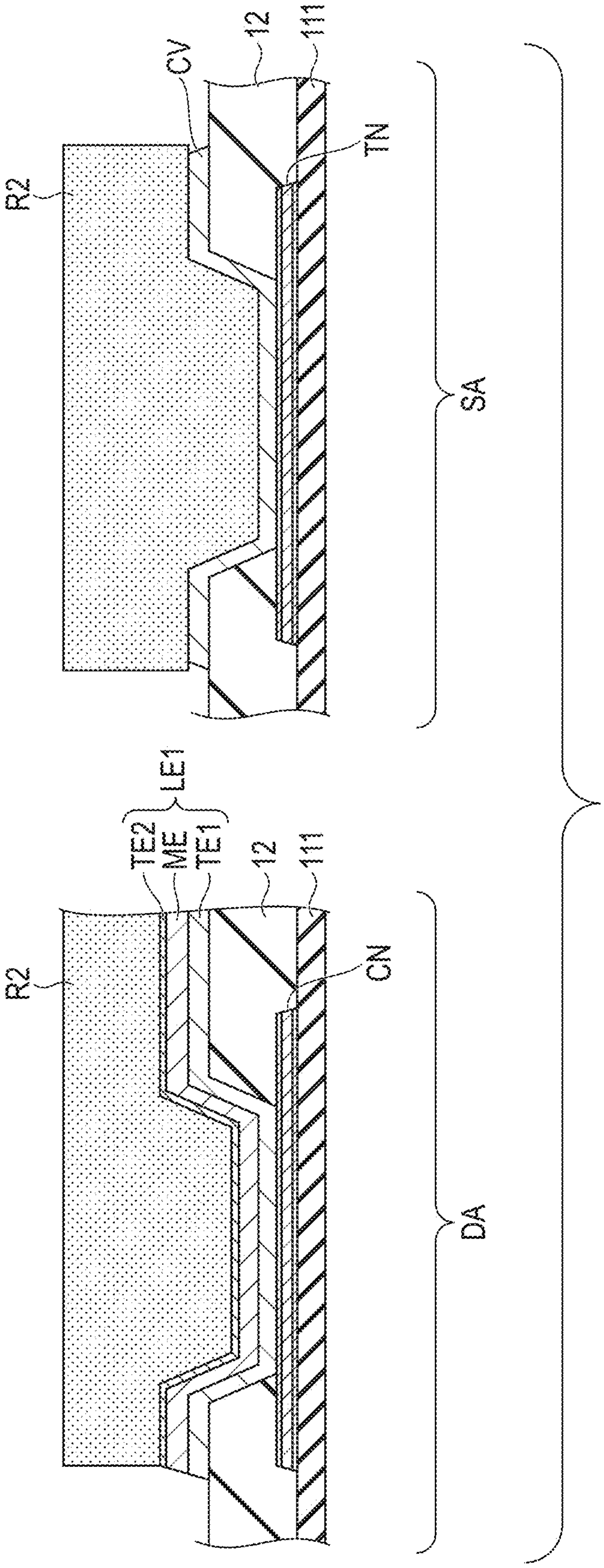
FIG. 13 is a diagram for explaining the manufacturing method of the display device DSP.

Subsequently, in step ST8, as shown in FIG. 13, the first transparent conductive layer 121 exposed from the resist R2 in the display area DA is removed by etching using the resist R2 as a mask. By this process, in the display area DA, the transparent electrode TE1 is formed immediately under the metal electrode ME, and the insulating layer 12 around the transparent electrode TE1 is exposed. At this time, the cover electrode CV is slightly retracted from the edge portion of the resist R2.

Figure 14:
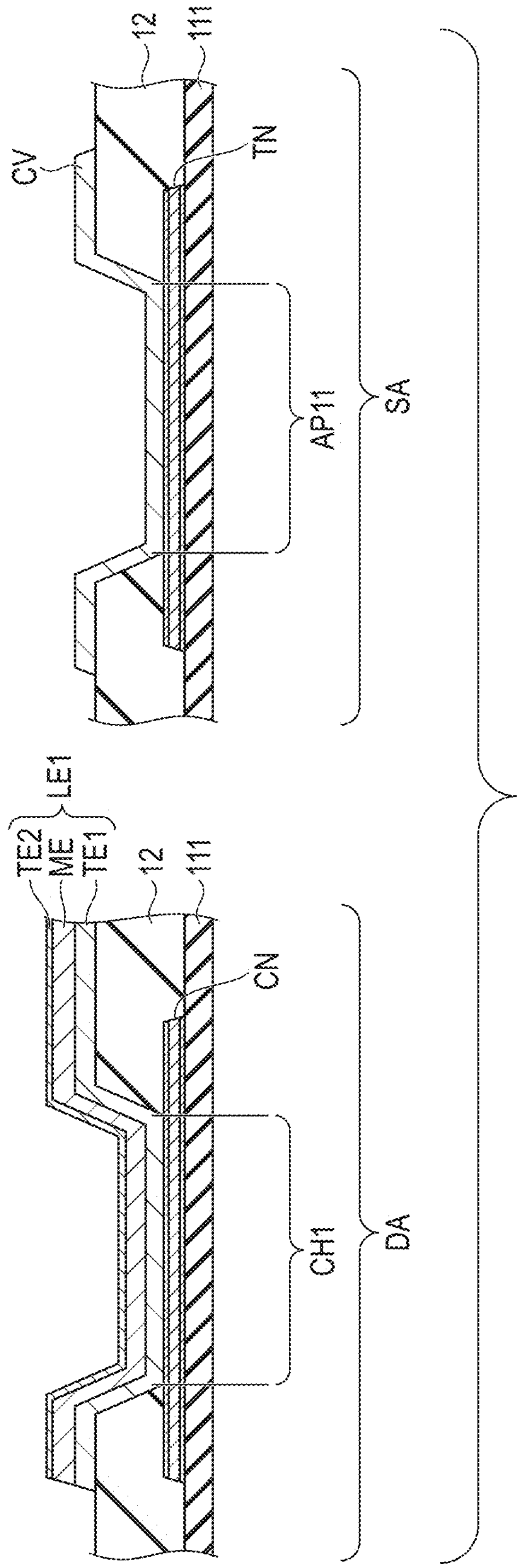
FIG. 14 is a diagram for explaining the manufacturing method of the display device DSP.

Subsequently, in step ST9, as shown in FIG. 14, the resist R2 is removed.

In this manner, the lower electrode LE1 electrically connected to the connection electrode CN in the contact hole CH1 is formed in the display area DA by patterning the first transparent conductive layer 121, the first metal layer 122 and the second transparent conductive layer 123. The cover electrode CV which covers the terminal electrode TN exposed from the insulating layer 12 is formed in the surrounding area SA by patterning the first transparent conductive layer 121. Here, the process of forming the lower electrode LE1 of the display area DA is explained. At the same time as the lower electrode LE1, the lower electrode LE2 and the lower electrode LE3 are also formed.

Figure 15:
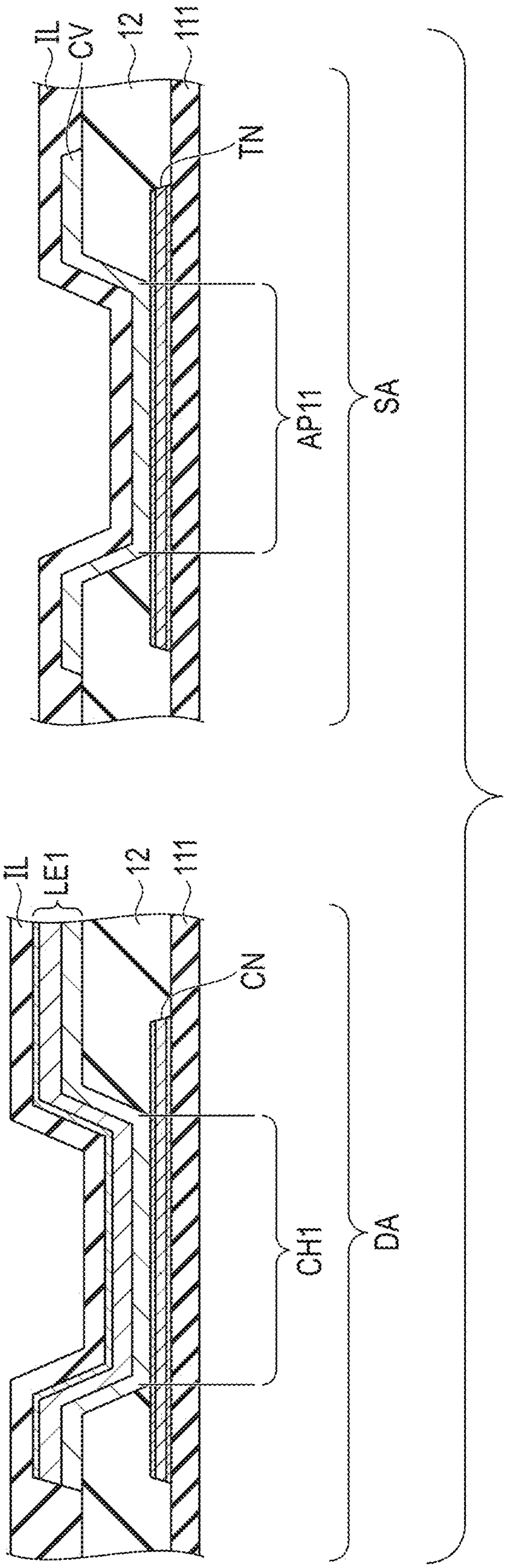
FIG. 15 is a diagram for explaining the manufacturing method of the display device DSP.

Subsequently, in step ST10, as shown in FIG. 15, an inorganic insulating layer IL is formed over the display area DA and the surrounding area SA. By this process, the insulating layer 12, the lower electrode LE1 and the cover electrode CV are covered with the inorganic insulating layer IL.

Figure 16:
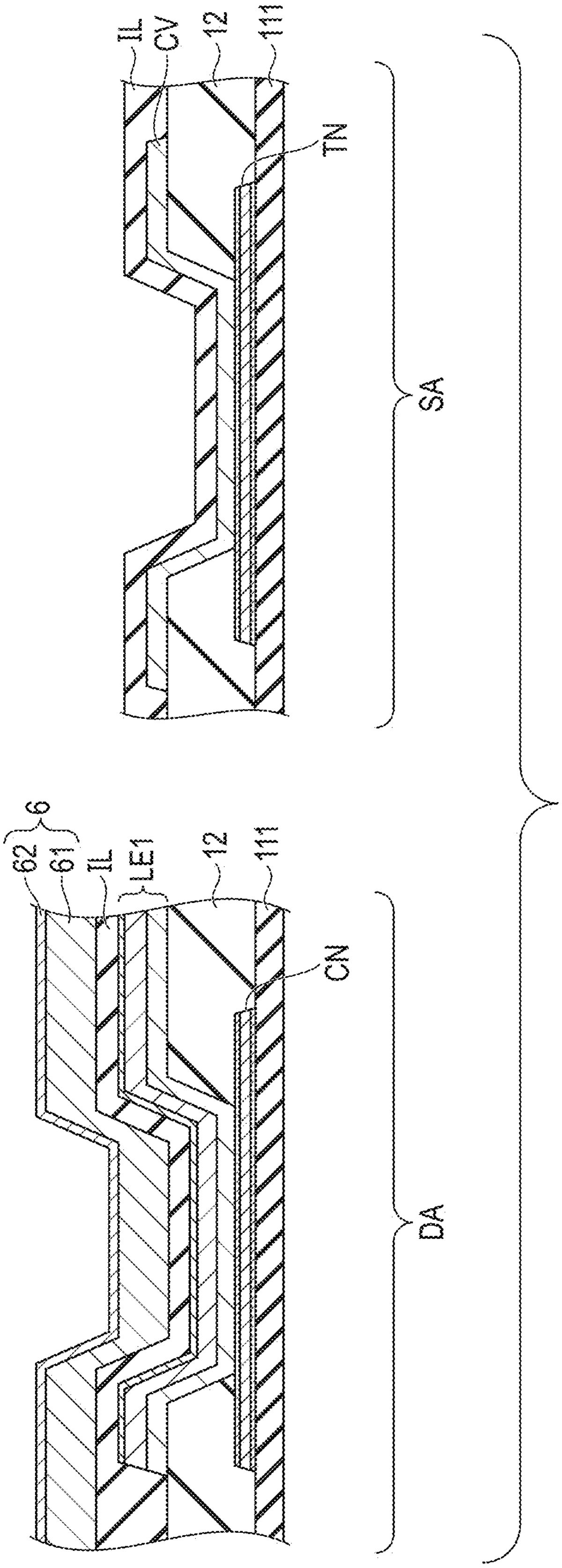
FIG. 16 is a diagram for explaining the manufacturing method of the display device DSP.

Subsequently, in step ST11, as shown in FIG. 16, the partition 6 which comprises the lower portion 61 located on the inorganic insulating layer IL and formed of a conductive material and the upper portion 62 located on the lower portion 61 and protruding from the side surfaces of the lower portion 61 is formed in the display area DA. In the process of forming the partition 6, first, a metal layer is formed on the inorganic insulating layer IL. Subsequently, a thin film is formed. Subsequently, a resist having a predetermined shape is formed. The thin film exposed from the resist is removed by etching using the resist as a mask. Subsequently, the metal layer exposed from the resist is removed by anisotropic etching and isotropic etching. By this process, the partition 6 is formed.

Figure 17:
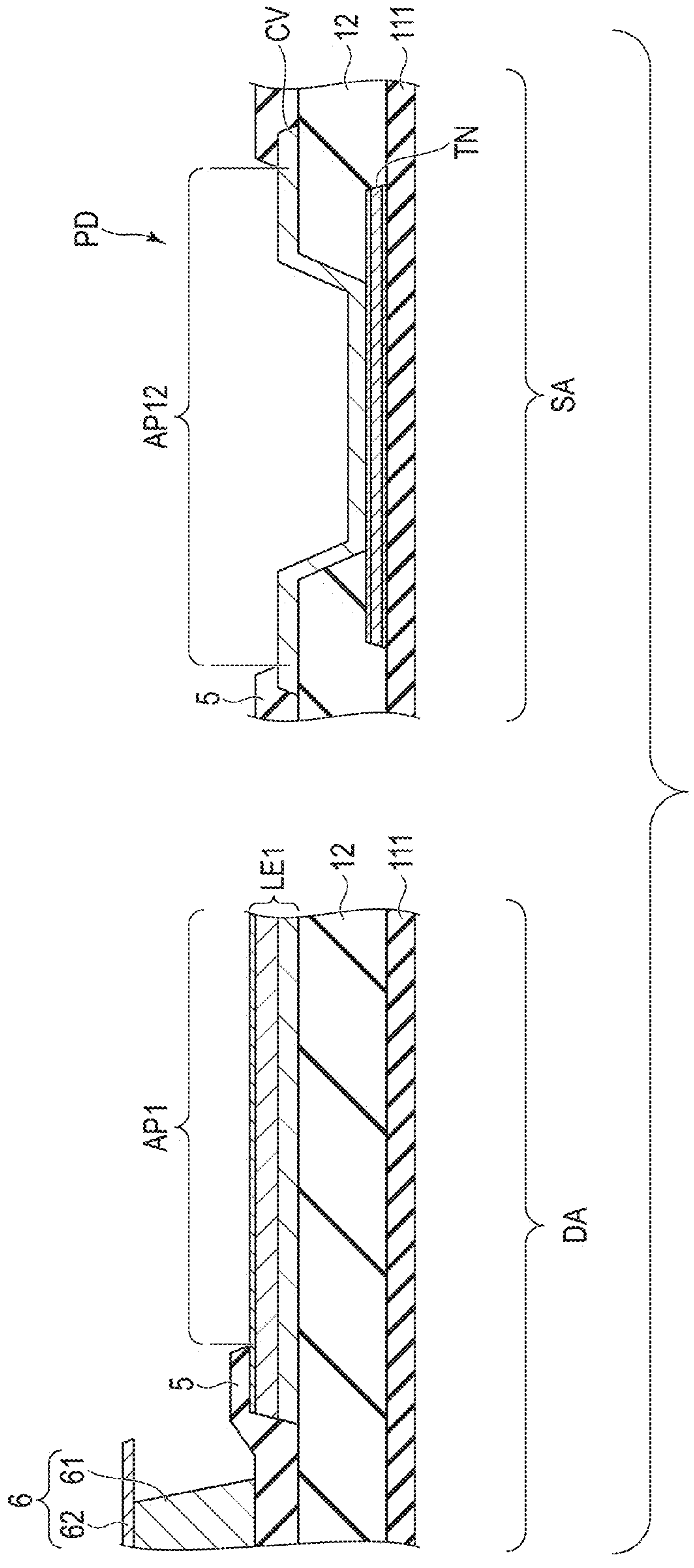
FIG. 17 is a diagram for explaining the manufacturing method of the display device DSP.

Subsequently, in step ST12, as shown in FIG. 17, the rib 5 which comprises the aperture AP1 overlapping the lower electrode LE1 and the aperture AP12 overlapping the cover electrode CV is formed by patterning the inorganic insulating layer IL. The left side of FIG. 17 shows the section of the lower electrode LE1 which does not include the contact hole CH1. In this manner, the pad PD comprising the terminal electrode TN and the cover electrode CV is formed in the surrounding area SA.

Figure 18:
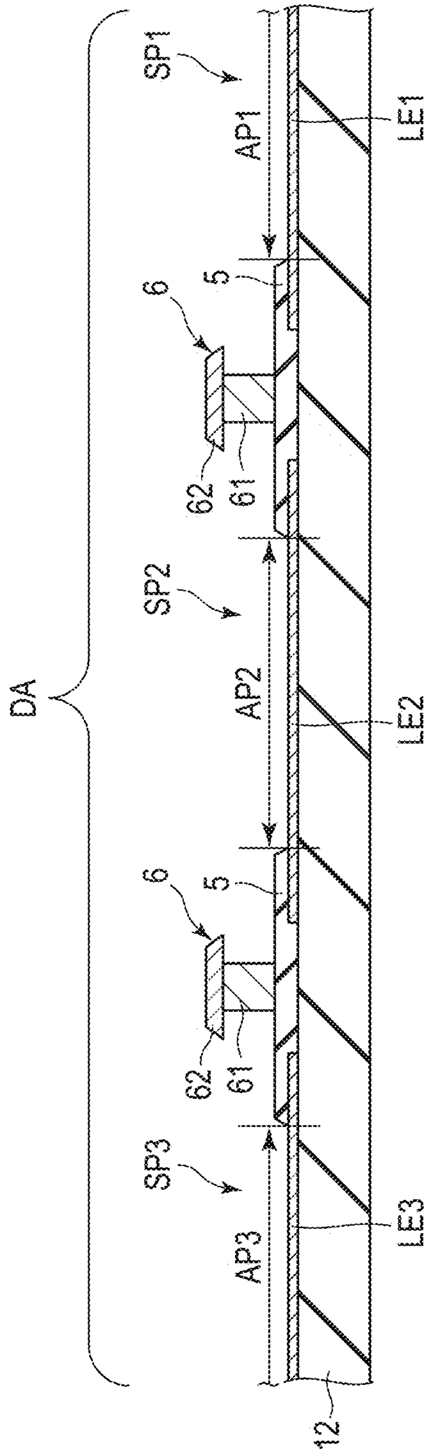
FIG. 18 is a diagram for explaining the manufacturing method of the display device DSP.

As shown in FIG. 18, in addition to the aperture AP1 overlapping the lower electrode LE1 of subpixel SP1, the aperture AP2 overlapping the lower electrode LE2 of subpixel SP2 and the aperture AP3 overlapping the lower electrode LE3 of subpixel SP3 are formed in the display area DA. In FIG. 18, the illustration of the layers located on the lower side of the insulating layer 12 is omitted.

Subsequently, the display element 201 is formed.

Figure 19:
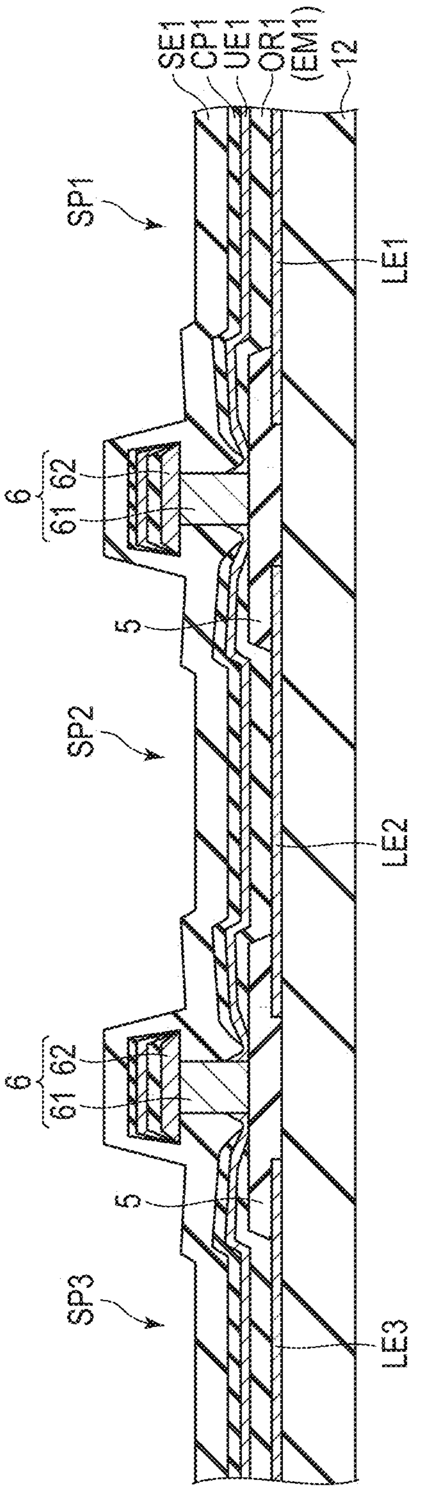
FIG. 19 is a diagram for explaining the manufacturing method of the display device DSP.

First, as shown in FIG. 19, the organic layer OR1 is formed by depositing the materials for forming the hole injection layer, the hole transport layer, the electron blocking layer, the light emitting layer (EM1), the hole blocking layer, the electron transport layer, the electron injection layer, etc., on the lower electrode LE1 in series.

Subsequently, the upper electrode UE1 is formed by depositing a mixture of magnesium and silver on the organic layer OR1. The upper electrode UE1 covers the organic layer OR1 and is in contact with the side surface of the lower portion 61.

Subsequently, the cap layer CP1 is formed by depositing a high-refractive material and a low-refractive material on the upper electrode UE1.

Subsequently, the sealing layer SE1 is formed so as to continuously cover the cap layer CP1 and the partition 6.

The organic layer OR1, the upper electrode UE1, the cap layer CP1 and the sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

The materials which are emitted from the evaporation source when the organic layer OR1, the upper electrode UE1 and the cap layer CP1 are formed by vapor deposition are blocked by the upper portion 62. Thus, each of the organic layer OR1, the upper electrode UE1 and the cap layer CP1 is partly stacked on the upper portion 62.

Figure 20:
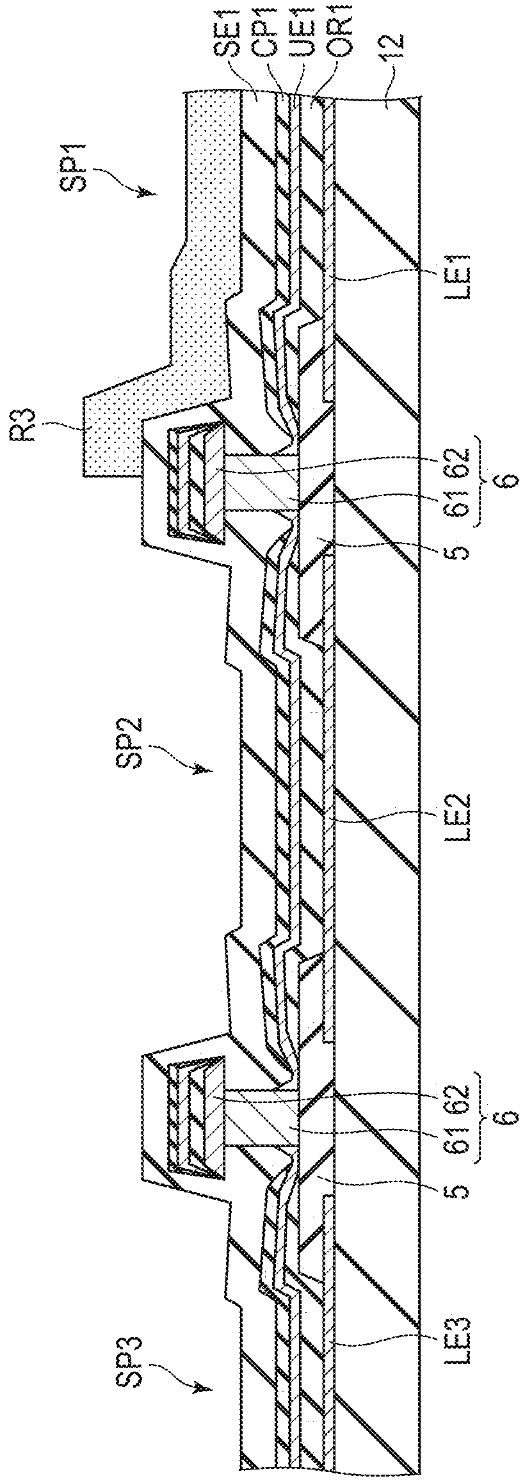
FIG. 20 is a diagram for explaining the manufacturing method of the display device DSP.

Subsequently, as shown in FIG. 20, a resist R3 having a predetermined shape is formed on the sealing layer SE1. The resist R3 covers subpixel SP1 and part of the partition 6 around subpixel SP1.

Figure 21:
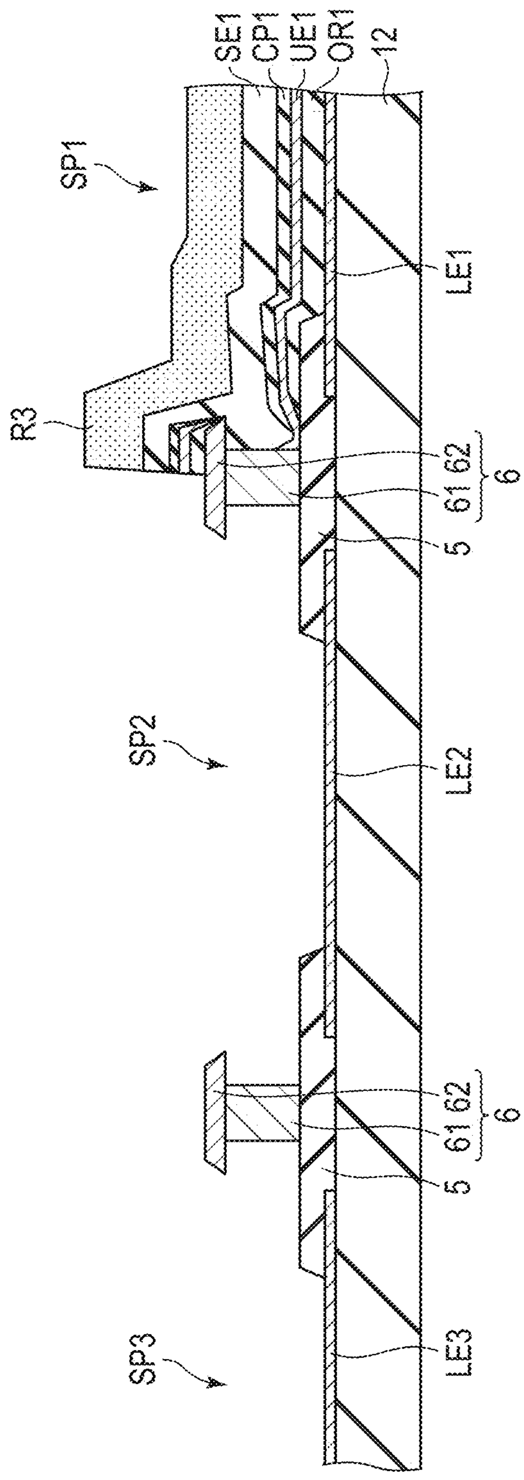
FIG. 21 is a diagram for explaining the manufacturing method of the display device DSP.

Subsequently, as shown in FIG. 21, the sealing layer SE1, cap layer CP1, upper electrode UE1 and organic layer OR1 exposed from the resist R3 are removed in series by etching using the resist R3 as a mask. In this manner, the lower electrode LE2 of subpixel SP2 and the lower electrode LE3 of subpixel SP3 are exposed.

Figure 22:
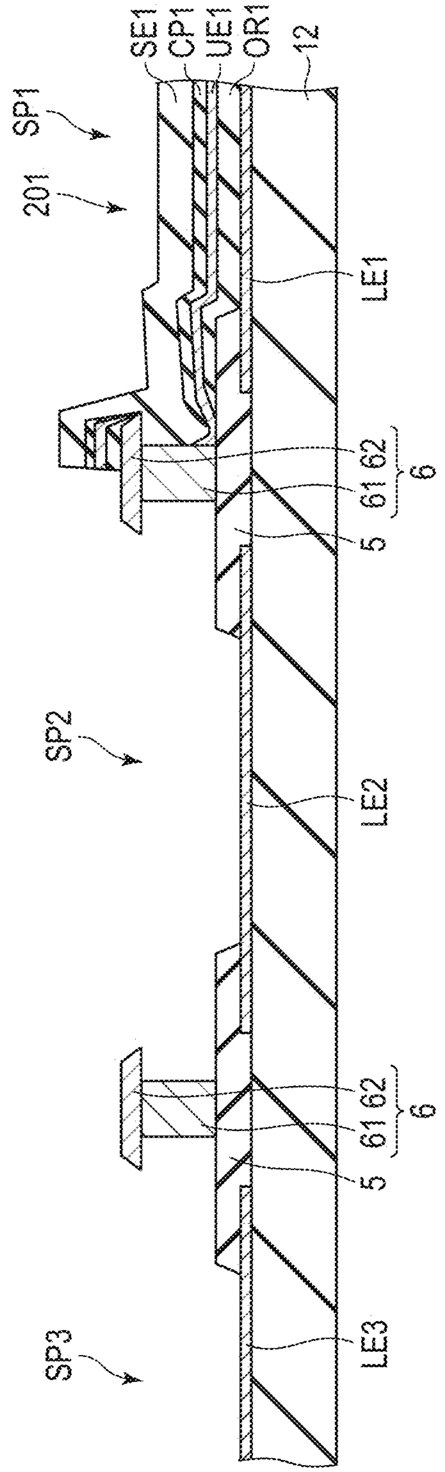
FIG. 22 is a diagram for explaining the manufacturing method of the display device DSP.

Subsequently, as shown in FIG. 22, the resist R3 is removed. By this process, the display element 201 is formed in subpixel SP1.

Figure 23:
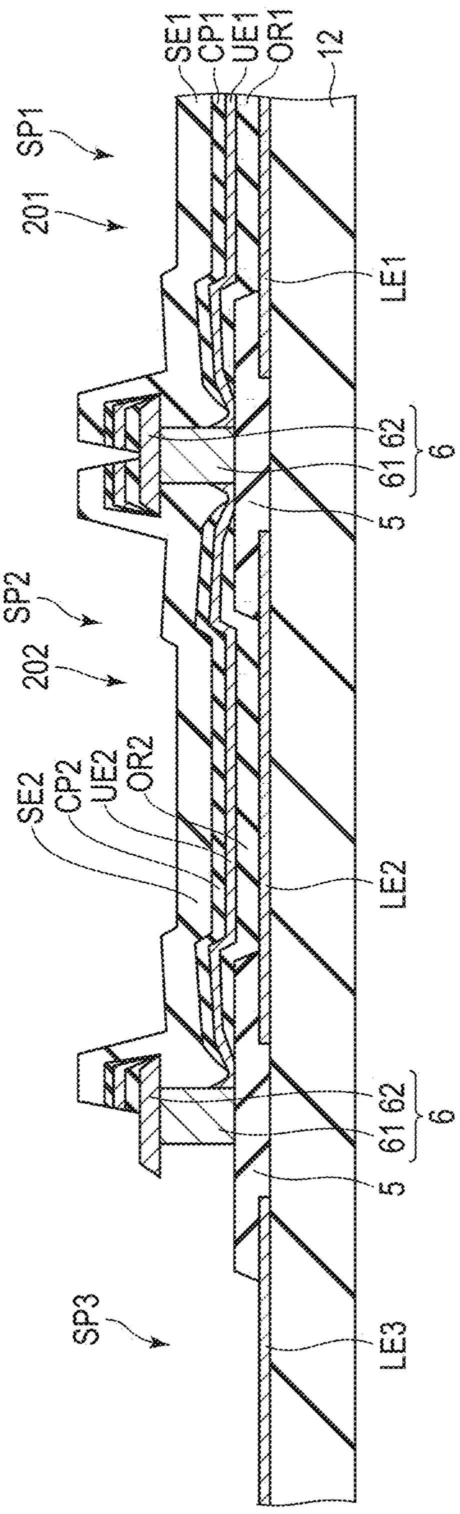
FIG. 23 is a diagram for explaining the manufacturing method of the display device DSP.

Subsequently, as shown in FIG. 23, the display element 202 is formed. The procedure of forming the display element 202 is similar to that of forming the display element 201. Specifically, the organic layer OR2 including the light emitting layer EM2, the upper electrode UE2, the cap layer CP2 and the sealing layer SE2 are formed in order on the lower electrode LE2. Subsequently, a resist is formed on the sealing layer SE2. The sealing layer SE2, the cap layer CP2, the upper electrode UE2 and the organic layer OR2 are patterned in series by etching using the resist as a mask. After this patterning, the resist is removed. In this manner, the display element 202 is formed in subpixel SP2, and the lower electrode LE3 of subpixel SP3 is exposed.

Figure 24:
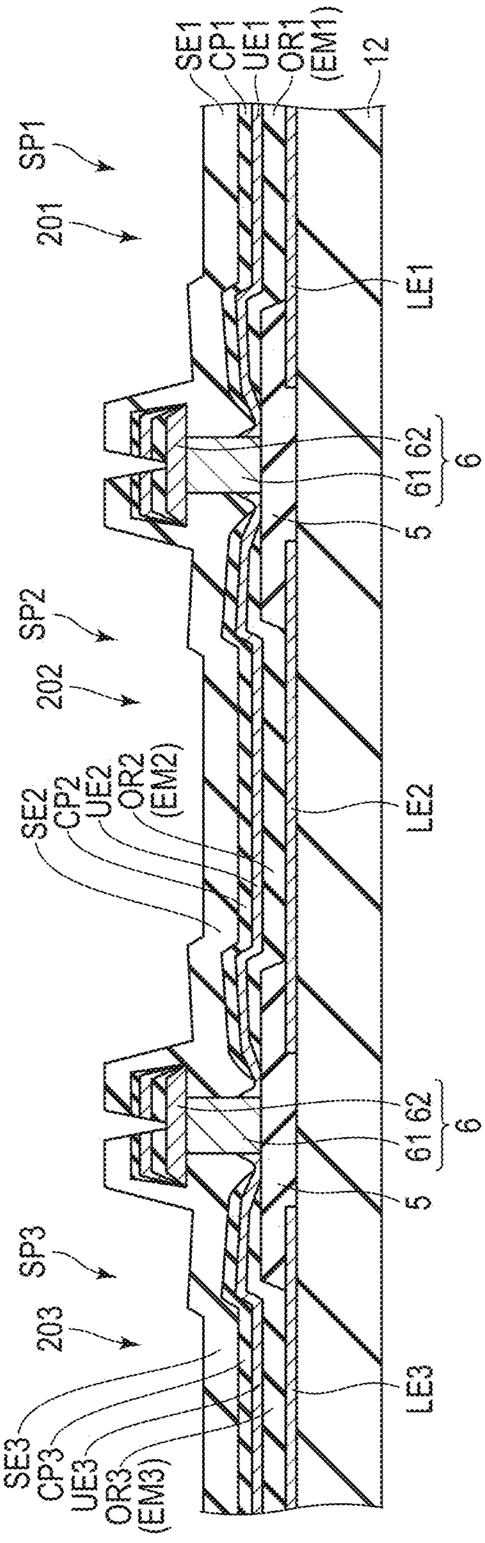
FIG. 24 is a diagram for explaining the manufacturing method of the display device DSP.

Subsequently, as shown in FIG. 24, the display element 203 is formed. The procedure of forming the display element 203 is similar to that of forming the display element 201. Specifically, the organic layer OR3 including the light emitting layer EM3, the upper electrode UE3, the cap layer CP3 and the sealing layer SE3 are formed in order on the lower electrode LE3. Subsequently, a resist is formed on the sealing layer SE3. The sealing layer SE3, the cap layer CP3, the upper electrode UE3 and the organic layer OR3 are patterned in series by etching using the resist as a mask. After this patterning, the resist is removed. By this process, the display element 203 is formed in subpixel SP3.

Subsequently, the resin layer 13, sealing layer 14 and resin layer 15 shown in FIG. 3 are formed in order. By this process, the display device DSP is completed. In the manufacturing process described above, this specification assumes a case where the display element 201 is formed firstly, and the display element 202 is formed secondly, and the display element 203 is formed lastly. However, the formation order of the display elements 201, 202 and 203 is not limited to this example.

According to configuration example 1 described above, the pad PD comprises the cover electrode CV covering the terminal electrode TN which is the metal electrode TME.

The cover electrode CV is formed of a conductive oxide. Thus, as the pad PD consists of a stacked layer body of the terminal electrode TN and the cover electrode CV, the strength of the pad PD can be assured when the IC chip and the flexible printed circuit are mounted on the pad PD.

In addition, compared to a case where the terminal electrode TN which is the metal electrode TME is exposed without providing the cover electrode CV, the oxidation or corrosion of the terminal electrode TN is prevented, thereby realizing a good electrical connection.

The cover electrode CV is formed of the same material by the same process as the transparent electrode constituting the lower electrode. Therefore, a separate process for forming the cover electrode CV is unnecessary. For example, in a case where the cover electrode CV is formed using ITO after the formation of the lower electrode, the rib, the partition, etc., the removal of a member or the degradation of electrical characteristics may be caused by the effect of the moisture contained in the organic insulating layer in the process of the crystallization of ITO. As the cover electrode CV is formed at the same time in the process of forming the lower electrode, problems to be caused by moisture can be prevented.

The transparent electrode located between the metal electrode of the lower electrode and the organic layer could be the cause of the reduction in the luminous efficiency as, for example, the transparent electrode absorbs the light emitted from the organic layer. For this reason, the thickness of the transparent electrode between the metal electrode and the organic layer should be preferably thin. To the contrary, the thickness of the cover electrode CV should be preferably thick to assure the strength of the pad PD.

Thus, the thickness of the transparent electrode located as the lower layer of the lower electrode is set so as to be greater than that of the transparent electrode located as the upper layer of the lower electrode. The cover electrode CV is formed by the same process as the transparent electrode located as the lower layer of the lower electrode and has a thickness equal to that of this transparent electrode. By this configuration, the reduction in the luminous efficiency is prevented in the display area DA, and the strength of the pad can be assured in the surrounding area SA. In addition, the entire lower electrode can be made thin by forming the transparent electrode as the upper layer of the lower electrode so as to be thin. Thus, the film break of the rib 5 which covers the peripheral portion of the lower electrode is prevented.

In this manner, the reduction in reliability is prevented.

Configuration Example 2

Figure 25:
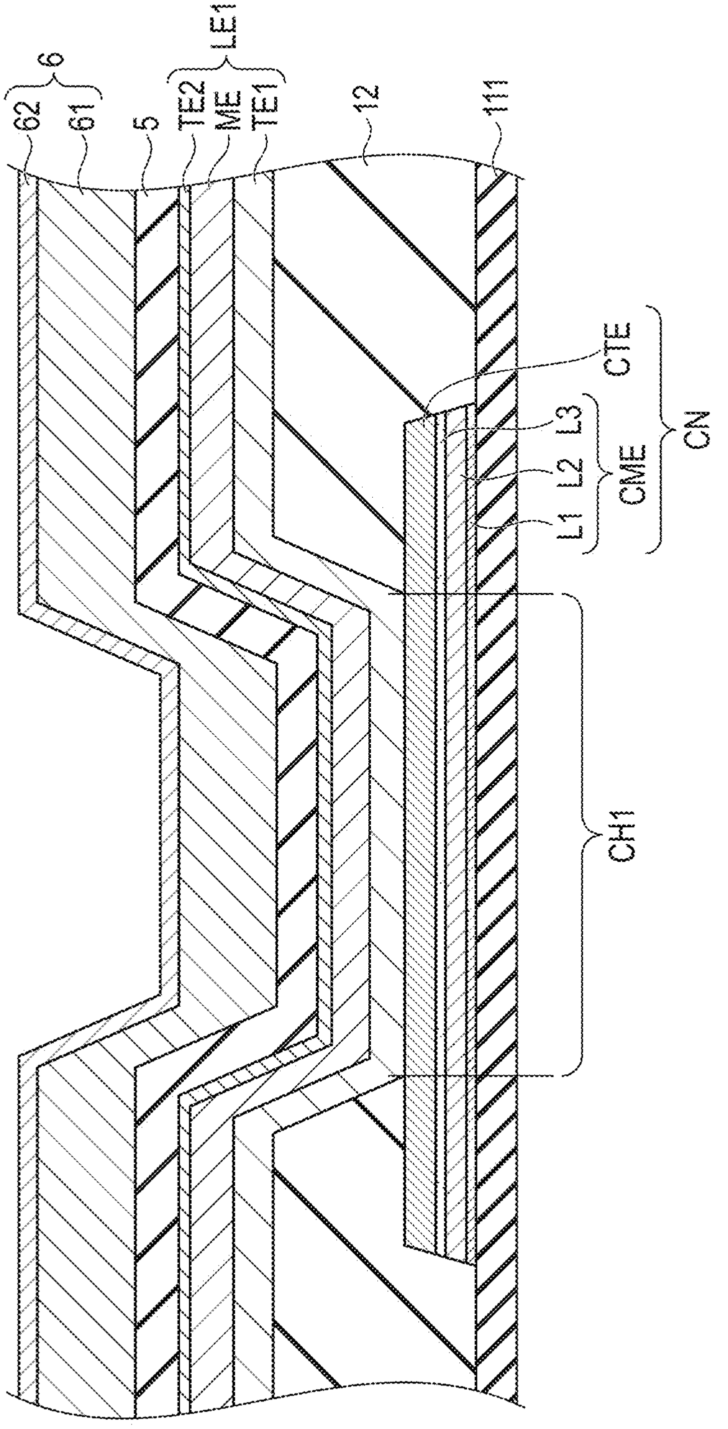
FIG. 25 is a cross-sectional view of configuration example 2 including the contact hole CH1 shown in FIG. 2.

FIG. 25 is a cross-sectional view of configuration example 2 including the contact hole CH1 shown in FIG. 2. In FIG. 25, the illustration of the layers located on the upper side of the partition 6 is omitted.

Configuration example 2 shown in FIG. 25 is different from configuration example 1 shown in FIG. 4 in respect that the connection electrode CN comprises a metal electrode CME and a transparent electrode CTE.

The metal electrode CME is located on the insulating layer 111 and is a multilayer body comprising a plurality of thin films formed of metal materials different from each other. For example, the metal electrode CME comprises a titanium-based thin film L1, an aluminum-based thin film L2 located on the thin film L1 and a titanium-based thin film L3 located on the thin film L2.

The transparent electrode CTE is provided on the metal electrode CME. For example, the transparent electrode CTE is formed of a transparent conductive oxide such as ITO.

The peripheral portion of the connection electrode CN is covered with the insulating layer 12. The insulating layer 12 is in contact with a side surface of the metal electrode CME and a side surface of the transparent electrode CTE. The contact hole CH1 formed in the insulating layer 12 communicates with the connection electrode CN. In the contact hole CH1, the transparent electrode CTE is exposed from the insulating layer 12.

In a manner similar to that of configuration example 1, the lower electrode LE1 is provided on the insulating layer 12 and is electrically connected to the connection electrode CN in the contact hole CH1. The lower electrode LE1 comprises the transparent electrode TE1, the metal electrode ME and the transparent electrode TE2. The transparent electrode TE1 of the lower electrode LE1 is in contact with the transparent electrode CTE in the contact hole CH1. Each of the transparent electrodes TE1 and TE2 is formed of a transparent conductive oxide such as ITO. The metal electrode ME is formed of a metal material such as silver.

The rib 5 and the lower and upper portions 61 and 62 of the partition 6 overlap the lower electrode LE1 in the contact hole CH1.

Here, this specification explains the connection structure between the connection electrode CN and the lower electrode LE1 in the contact hole CH1. In configuration example 2, the connection structure between the connection electrode and the lower electrode LE2 in the contact hole CH2 and the connection structure between the connection electrode and the lower electrode LE3 in the contact hole CH3 are similar to the connection structure shown in FIG. 25.

Figure 26:
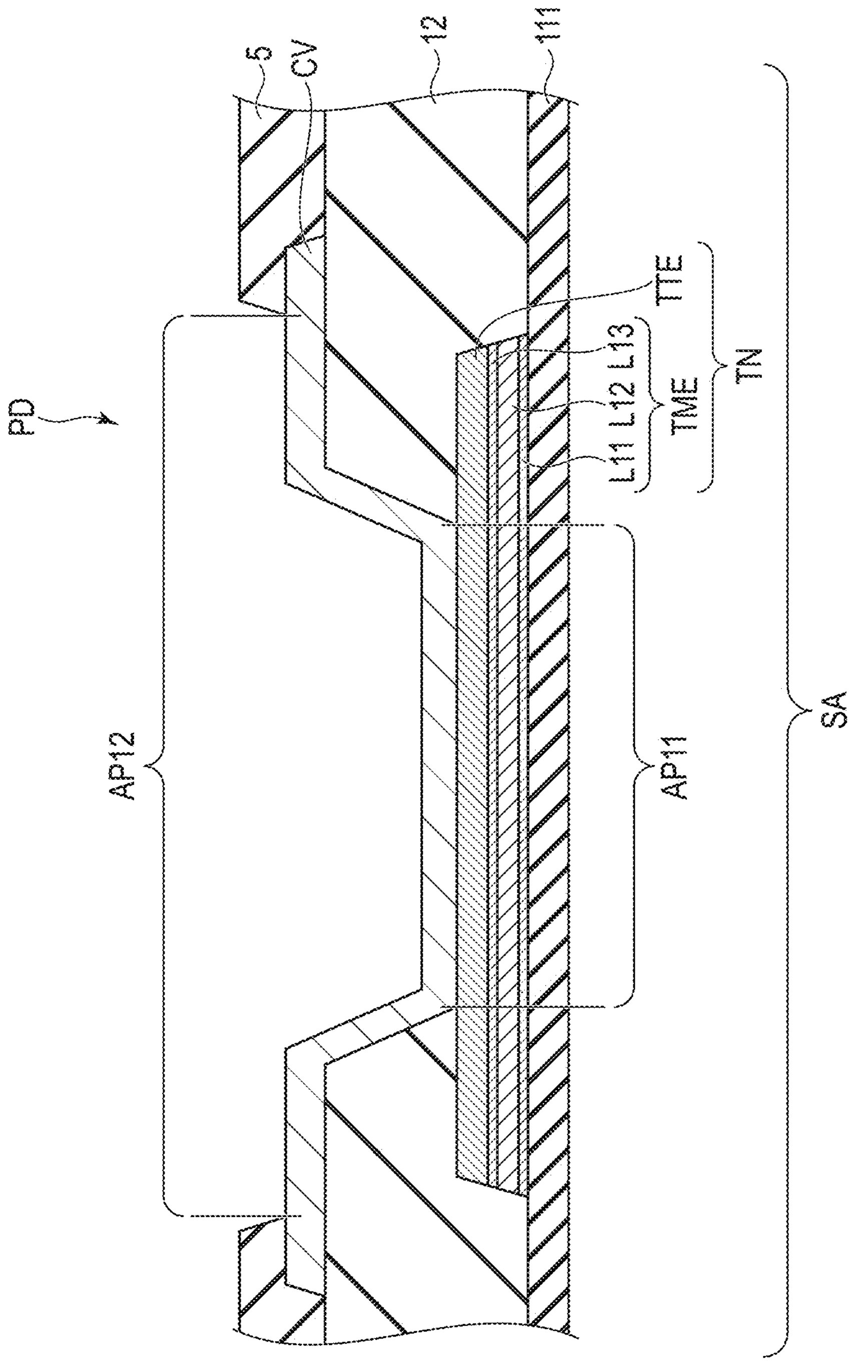
FIG. 26 is a cross-sectional view of configuration example 2 of the pad PD shown in FIG. 1.

FIG. 26 is a cross-sectional view of configuration example 2 of the pad PD shown in FIG. 1.

Configuration example 2 shown in FIG. 26 is different from configuration example 1 shown in FIG. 5 in respect that the terminal electrode TN constituting the pad PD comprises a metal electrode TME and a transparent electrode TTE.

The metal electrode TME is located on the insulating layer 111 and is a multilayer body comprising a plurality of thin films formed of metal materials different from each other. In the example shown here, the metal electrode TME is formed of the same material as the metal electrode CME shown in FIG. 25. Specifically, the metal electrode TME comprises a titanium-based thin film L11, an aluminum-based thin film L12 located on the thin film L11 and a titanium-based thin film L13 located on the thin film L12.

The transparent electrode TTE is provided on the metal electrode TME. The transparent electrode TTE is formed of the same material as the transparent electrode CTE shown in FIG. 25 and is formed of, for example, a transparent conductive oxide such as ITO.

The peripheral portion of the terminal electrode TN is covered with the insulating layer 12. The insulating layer 12 is in contact with a side surface of the metal electrode TME and a side surface of the transparent electrode TTE. The insulating layer 12 comprises the aperture AP11 from which the transparent electrode TTE of the terminal electrode TN is exposed.

The cover electrode CV is provided on the insulating layer 12, is in contact with the terminal electrode TN exposed from the insulating layer 12 at the aperture AP11 and covers the terminal electrode TN. Thus, the cover electrode CV is in contact with the transparent electrode TTE. The cover electrode CV is formed of the same material as the transparent electrode TE1 of the lower electrode LE1 shown in FIG. 25. Thus, the cover electrode CV is a transparent electrode and is formed of a transparent conductive oxide such as ITO.

The rib 5 comprises the aperture AP12 from which the cover electrode CV is exposed.

Now, this specification explains the manufacturing method of the display device in configuration example 2.

Figure 27:
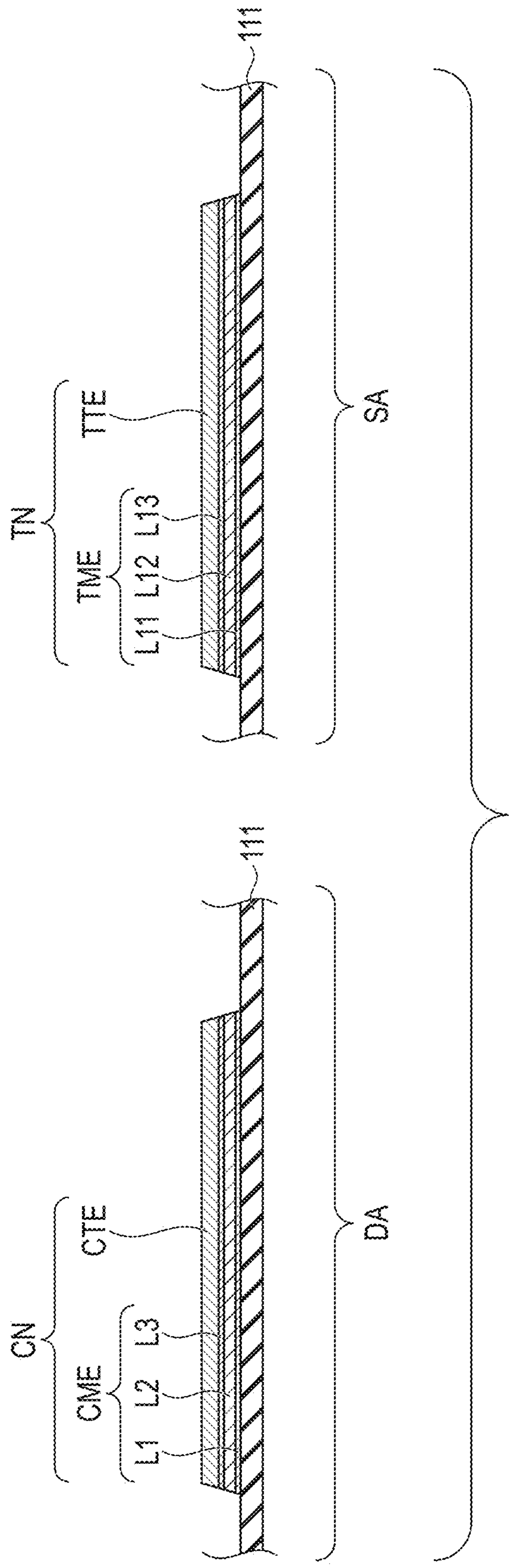
FIG. 27 is a diagram for explaining the manufacturing method of the display device DSP.

First, in step ST21, as shown in FIG. 27, the connection electrode CN located on the insulating layer 111 is formed in the display area DA, and the terminal electrode TN located on the insulating layer 111 is formed in the surrounding area SA. In the process of forming the connection electrode CN and the terminal electrode TN, first, the second metal layer is formed on the insulating layer 111. The second metal layer is a multilayer body formed of a material different from that of the first metal layer 122. As the second metal layer, a titanium-based metal layer, an aluminum-based metal layer and a titanium-based metal layer are formed in order on the insulating layer 111. Subsequently, a third transparent conductive layer is formed using ITO. Subsequently, a resist having a predetermined shape is formed. The third transparent conductive layer exposed from the resist is removed by etching using the resist as a mask. Subsequently, the second metal layer exposed from the resist is removed. By this process, the connection electrode CN comprising the metal electrode CME comprising the thin films L1 to L3 and the transparent electrode CTE is formed. At the same time, the terminal electrode TN comprising the metal electrode TME comprising the thin films L11 to L13 and the transparent electrode TTE is formed.

Figure 28:
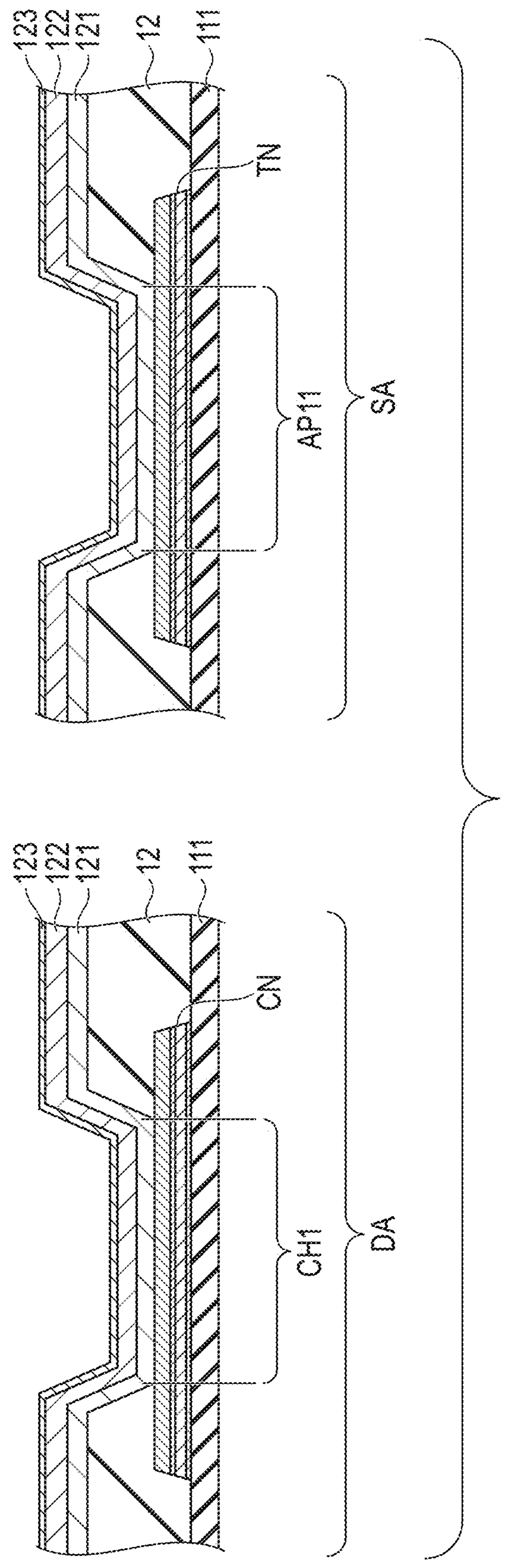
FIG. 28 is a diagram for explaining the manufacturing method of the display device DSP.

Subsequently, in step ST22, as shown in FIG. 28, the insulating layer 12 is formed. The insulating layer 12 comprises the contact hole CH1 communicating with the connection electrode CN, etc., in the display area DA and is formed so as to overlap the peripheral portion of the terminal electrode TN in the surrounding area SA. In the aperture AP11 of the insulating layer 12, the terminal electrode TN is exposed.

Subsequently, the first transparent conductive layer 121 is formed over the display area DA and the surrounding area SA. Subsequently, the first metal layer 122 is formed on the first transparent conductive layer 121. Further, the second transparent conductive layer 123 is formed on the first metal layer 122. The first transparent conductive layer 121 is in contact with the connection electrode CN in the contact hole CH1 of the display area DA and is in contact with the terminal electrode TN in the aperture AP11 of the surrounding area SA. For example, the first transparent conductive layer 121 and the second transparent conductive layer 123 are formed of ITO, and the first metal layer 122 is formed of silver.

Figure 29:
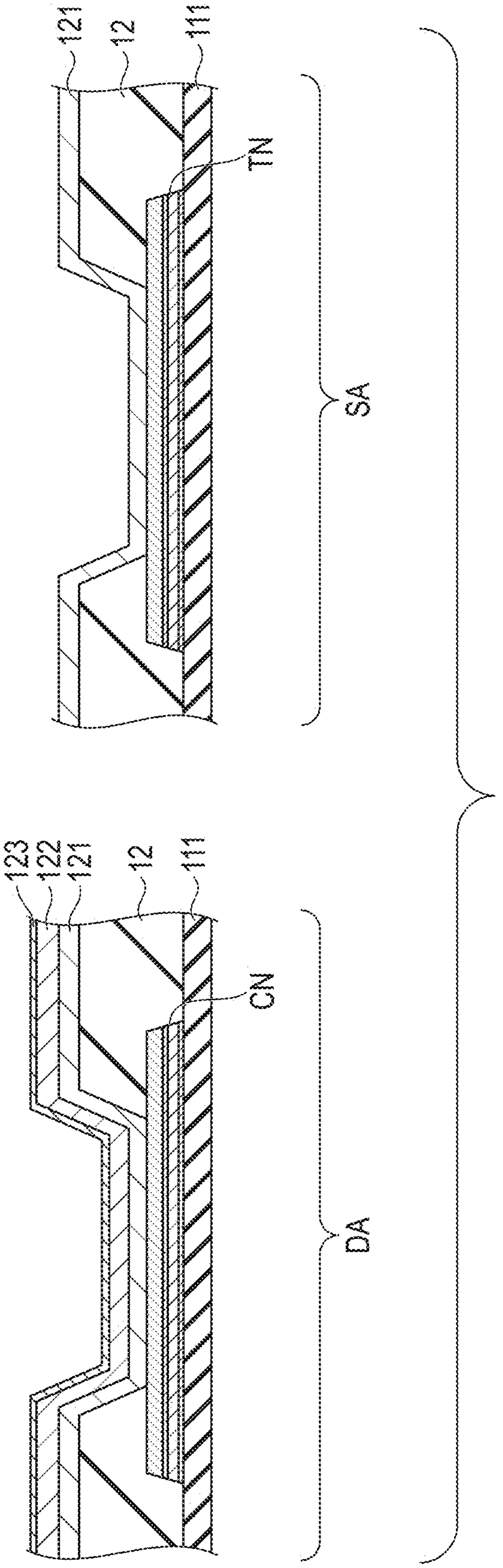
FIG. 29 is a diagram for explaining the manufacturing method of the display device DSP.

Subsequently, in step ST23, as shown in FIG. 29, the first transparent conductive layer 121 of the surrounding area SA is exposed. Step ST23 includes step ST2 explained with reference to FIG. 7, step ST3 explained with reference to FIG. 8 and step ST4 explained with reference to FIG. 9.

Figure 30:
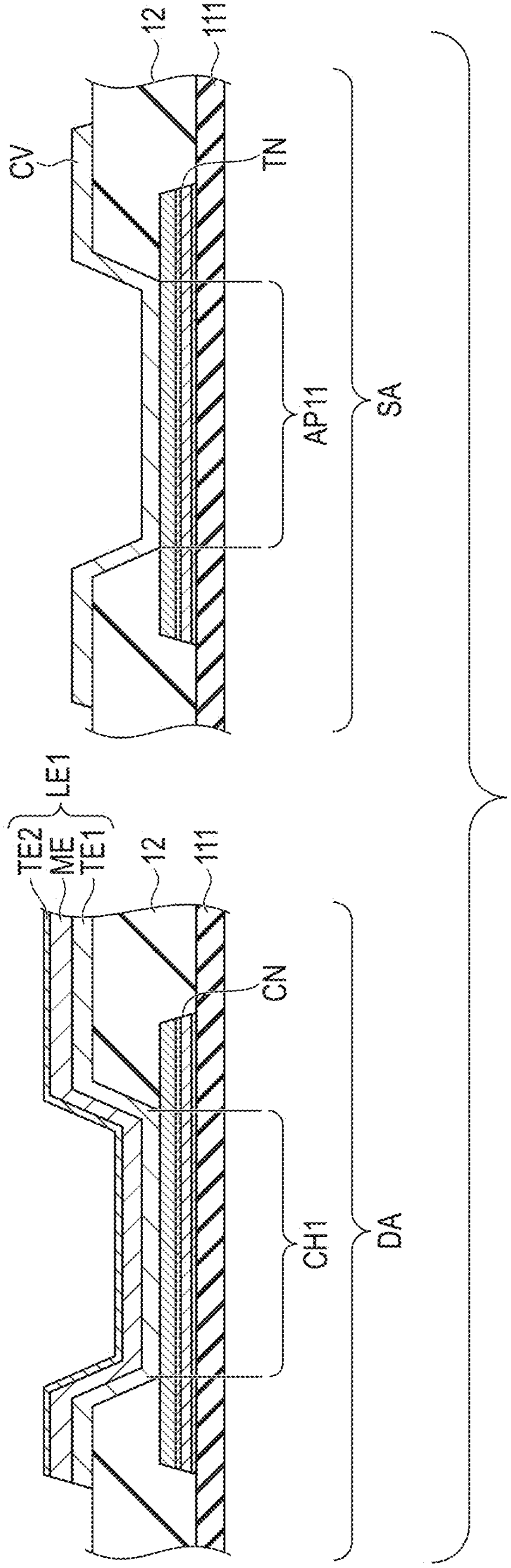
FIG. 30 is a diagram for explaining the manufacturing method of the display device DSP.

Subsequently, in step ST24, as shown in FIG. 30, the lower electrode LE1 is formed in the display area DA, and the cover electrode CV is formed in the surrounding area SA. Step ST24 includes step ST5 explained with reference to FIG. 10, step ST6 explained with reference to FIG. 11, step ST7 explained with reference to FIG. 12, step ST8 explained with reference to FIG. 13 and step ST9 explained with reference to FIG. 14.

In this manner, the lower electrode LE1 electrically connected to the connection electrode CN in the contact hole CH1 is formed in the display area DA by patterning the first transparent conductive layer 121, the first metal layer 122 and the second transparent conductive layer 123. The cover electrode CV which covers the terminal electrode TN exposed from the insulating layer 12 is formed in the surrounding area SA by patterning the first transparent conductive layer 121. Here, the process of forming the lower electrode LE1 of the display area DA is explained. At the same time as the lower electrode LE1, the lower electrode LE2 and the lower electrode LE3 are also formed.

Subsequently, step ST10 explained with reference to FIG. 15, step ST11 explained with reference to FIG. 16 and step ST12 explained with reference to FIG. 17 are performed to form the rib 5 and the partition 6.

Subsequently, the display elements 201 to 203 are formed through the processes shown in FIG. 18 to FIG. 24.

Subsequently, the resin layer 13, the sealing layer 14 and the resin layer 15 are formed in order, and the display device DSP is completed.

According to configuration example 2 described above, the terminal electrode TN of the pad PD comprises the transparent electrode TTE on the metal electrode TME. The transparent electrode TTE is covered with the cover electrode CV. Each of the transparent electrode TTE and the cover electrode CV is formed of a conductive oxide. Thus, as the pad PD consists of a stacked layer body of the metal electrode TME, the transparent electrode TTE and the cover electrode CV, the strength of the pad PD can be assured when the IC chip and the flexible printed circuit are mounted on the pad PD.

Further, the oxidation or corrosion of the terminal electrode TN is prevented, thereby realizing a good electrical connection.

The cover electrode CV is formed of the same material by the same process as the transparent electrode constituting the lower electrode. Therefore, a separate process for forming the cover electrode CV is unnecessary.

Even if the thickness of the transparent electrode located as the lower layer of the lower electrode becomes thin to the extent that it is substantially equal to the thickness of the transparent electrode located as the upper layer of the lower electrode, as the terminal electrode TN comprises the transparent electrode TTE which is in contact with the cover electrode CV, the strength of the pad PD can be assured. Compared to the lower electrode of configuration example 1, the entire lower electrode can be made thinner. Thus, the film break of the rib 5 which covers the peripheral portion of the lower electrode is prevented.

In this manner, the reduction in reliability is prevented.

Configuration Example 3

Figure 31:
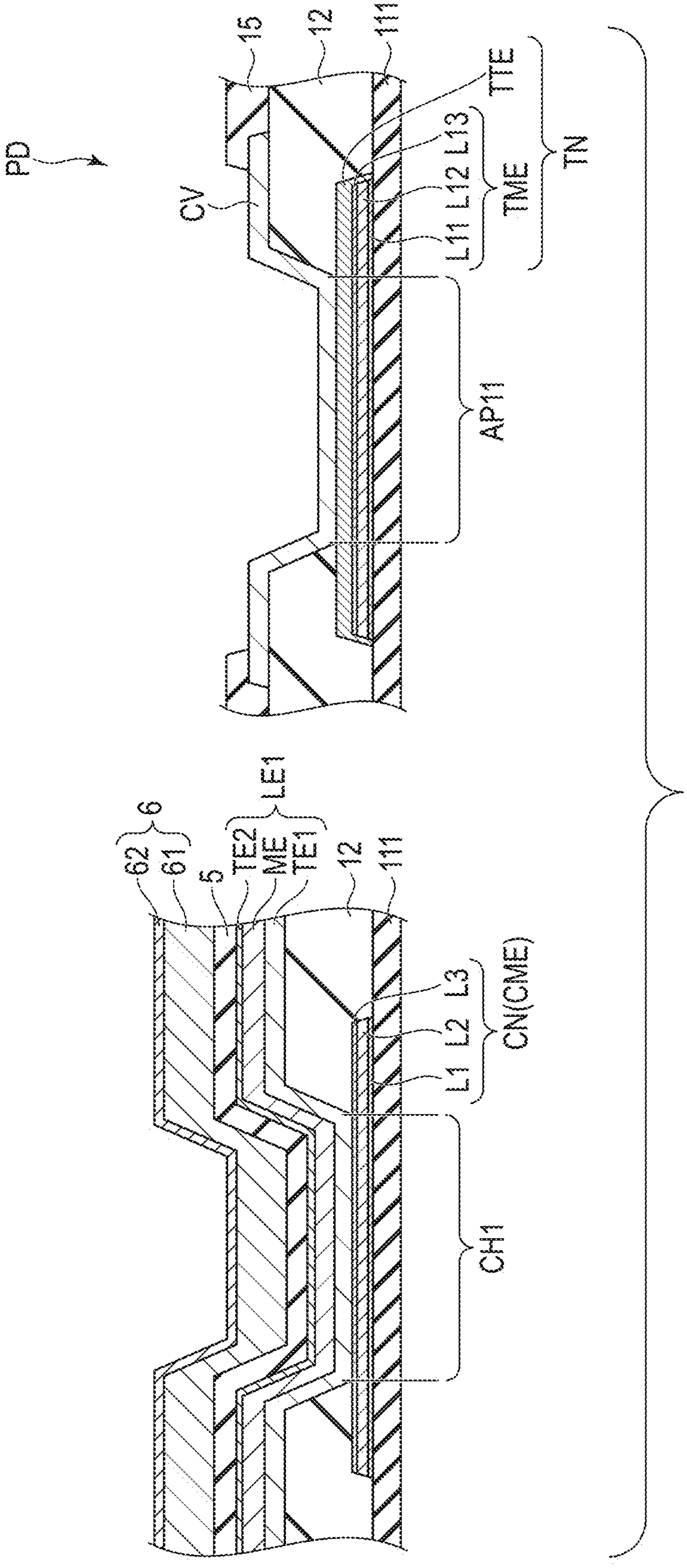
FIG. 31 is a cross-sectional view of configuration example 3 of the pad PD shown in FIG. 1 and configuration example 3 including the contact hole CH1 shown in FIG. 2.

FIG. 31 is a cross-sectional view of configuration example 3 of the pad PD shown in FIG. 1 and configuration example 3 including the contact hole CH1 shown in FIG. 2. In FIG. 31, the illustration of the layers located on the upper side of the partition 6 is omitted.

In configuration example 3 shown in FIG. 31, the connection electrode CN is the same as configuration example 1 shown in FIG. 4 and is the metal electrode CME located on the insulating layer 111. Thus, the connection electrode CN is a multilayer body comprising the titanium-based thin film L1, the aluminum-based thin film L2 and the titanium-based thin film L3. In the contact hole CH1, the transparent electrode TE1 of the lower electrode LE1 is in contact with the connection electrode CN.

Configuration example 3 is different from configuration example 1 shown in FIG. 5 in respect that the terminal electrode TN constituting the pad PD comprises the metal electrode TME and the transparent electrode TTE.

The metal electrode TME is provided on the insulating layer 111 and is a multilayer body comprising the titanium-based thin film L11, the aluminum-based thin film L12 and the titanium-based thin film L13.

The transparent electrode TTE is provided on the metal electrode TME. In the example shown in the figure, the transparent electrode TTE covers the metal electrode TME. The transparent electrode TTE is formed of the same material as the transparent electrode CTE and is formed of, for example, a transparent conductive oxide such as ITO.

The peripheral portion of the terminal electrode TN is covered with the insulating layer 12. The insulating layer 12 is in contact with a side surface of the transparent electrode TTE and is not in contact with a side surface of the metal electrode TME. The insulating layer 12 comprises the aperture AP11 from which the transparent electrode TTE of the terminal electrode TN is exposed.

The cover electrode CV is provided on the insulating layer 12 and covers the terminal electrode TN exposed from the insulating layer 12 at the aperture AP11. Thus, the cover electrode CV is in contact with the transparent electrode TTE. The cover electrode CV is formed of the same material as the transparent electrode TE1 of the lower electrode LE1. Thus, the cover electrode CV is a transparent electrode and is formed of a transparent conductive oxide such as ITO.

Here, this specification explains the connection structure between the connection electrode CN and the lower electrode LE1 in the contact hole CH1. In configuration example 3, the connection structure between the connection electrode and the lower electrode LE2 in the contact hole CH2 and the connection structure between the connection electrode and the lower electrode LE3 in the contact hole CH3 are similar to the connection structure shown in FIG. 31.

Now, this specification explains the manufacturing method of the display device in configuration example 3.

Figure 32:
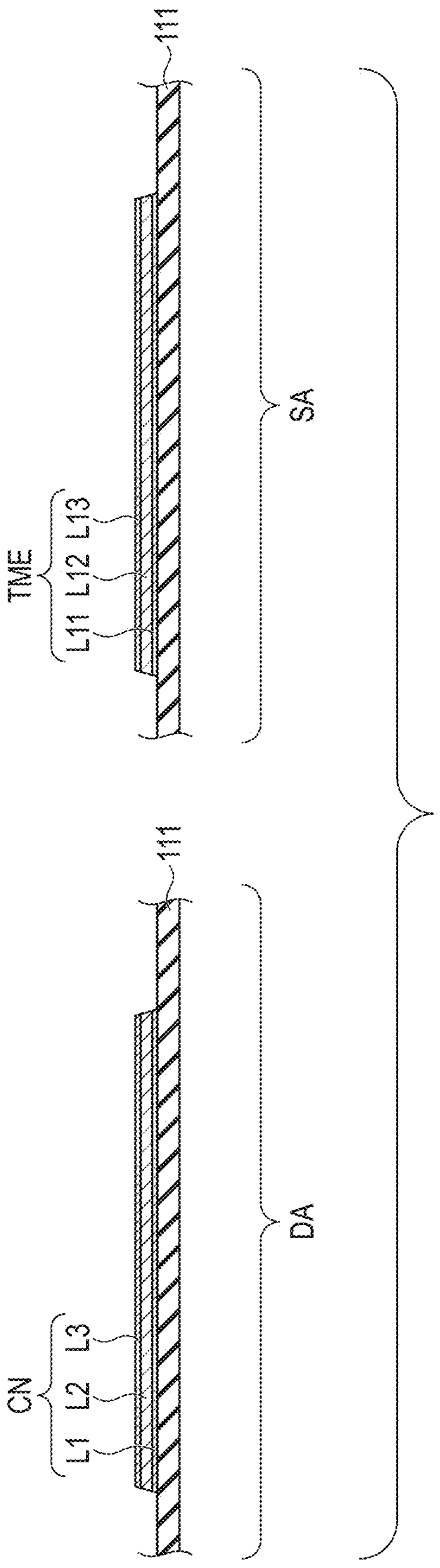
FIG. 32 is a diagram for explaining the manufacturing method of the display device DSP.

First, in step ST31, as shown in FIG. 32, the connection electrode CN located on the insulating layer 111 is formed in the display area DA, and the metal electrode TME which is the terminal electrode located on the insulating layer 111 is formed in the surrounding area SA. In the process of forming the connection electrode CN and the metal electrode TME, first, the second metal layer is formed on the insulating layer 111. The second metal layer is a multilayer body formed of a material different from that of the first metal layer 122. As the second metal layer, a titanium-based metal layer, an aluminum-based metal layer and a titanium-based metal layer are formed in order on the insulating layer 111. Subsequently, a resist having a predetermined shape is formed. The second metal layer exposed from the resist is removed by etching using the resist as a mask. By this process, the connection electrode CN comprising the thin films L1 to L3 is formed. At the same time, the metal electrode TME comprising the thin films L11 to L13 is formed.

Figure 33:
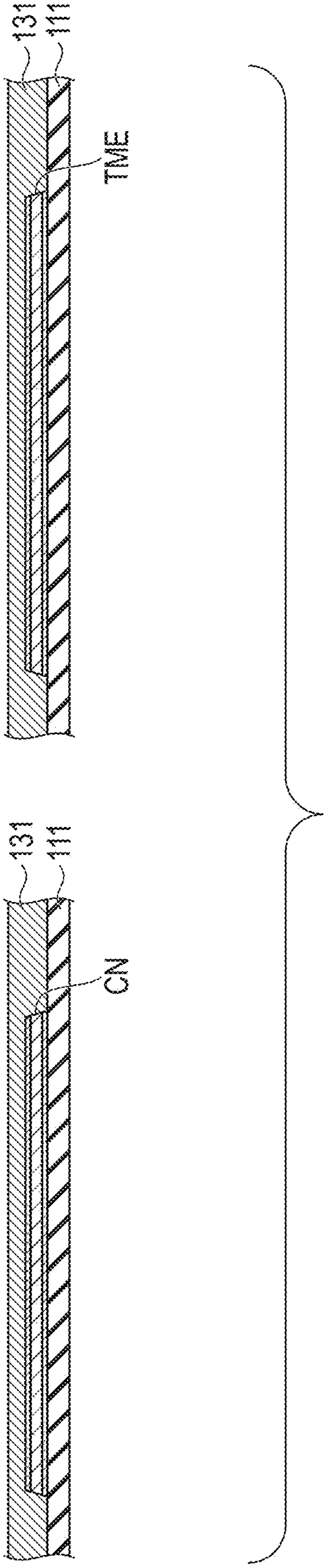
FIG. 33 is a diagram for explaining the manufacturing method of the display device DSP.

Subsequently, in step ST32, as shown in FIG. 33, the third transparent conductive layer 131 is formed over the display area DA and the surrounding area SA. The third transparent conductive layer 131 covers the insulating layer 12 and covers the connection electrode CN of the display area DA and the metal electrode TME of the surrounding area SA. The third transparent conductive layer 131 is formed of ITO.

Figure 34:
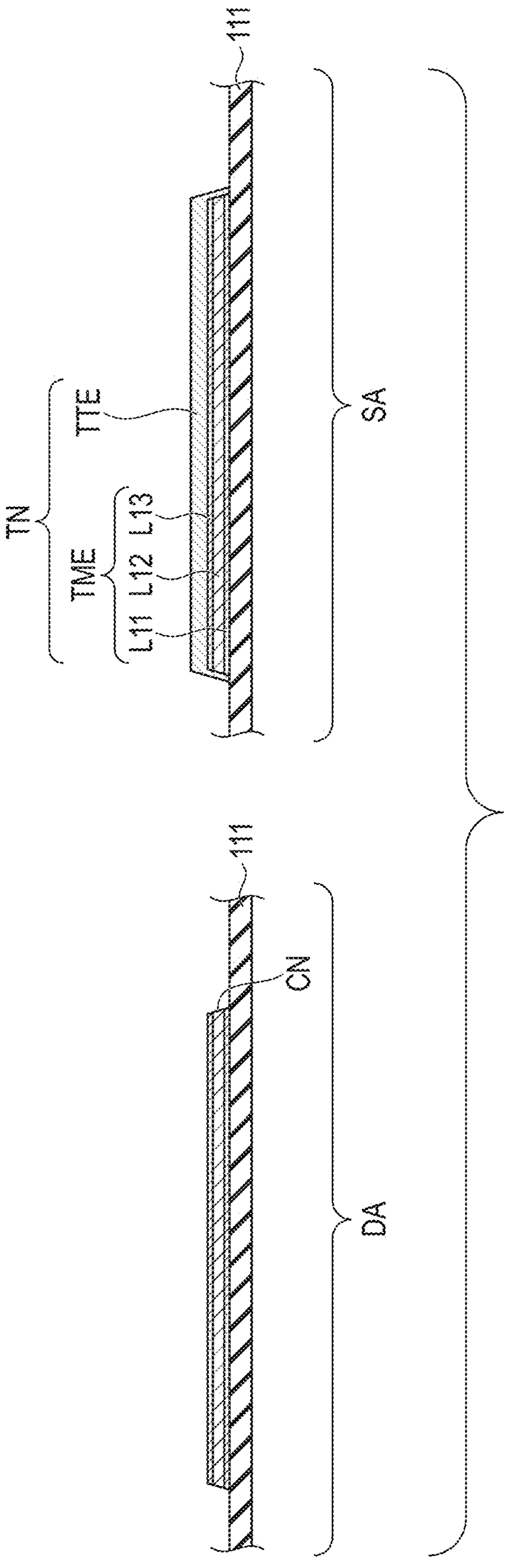
FIG. 34 is a diagram for explaining the manufacturing method of the display device DSP.

Subsequently, in step ST33, as shown in FIG. 34, the transparent electrode TTE of the surrounding area SA is formed by patterning the third transparent conductive layer 131. In the display area DA, the connection electrode CN is exposed.

Figure 35:
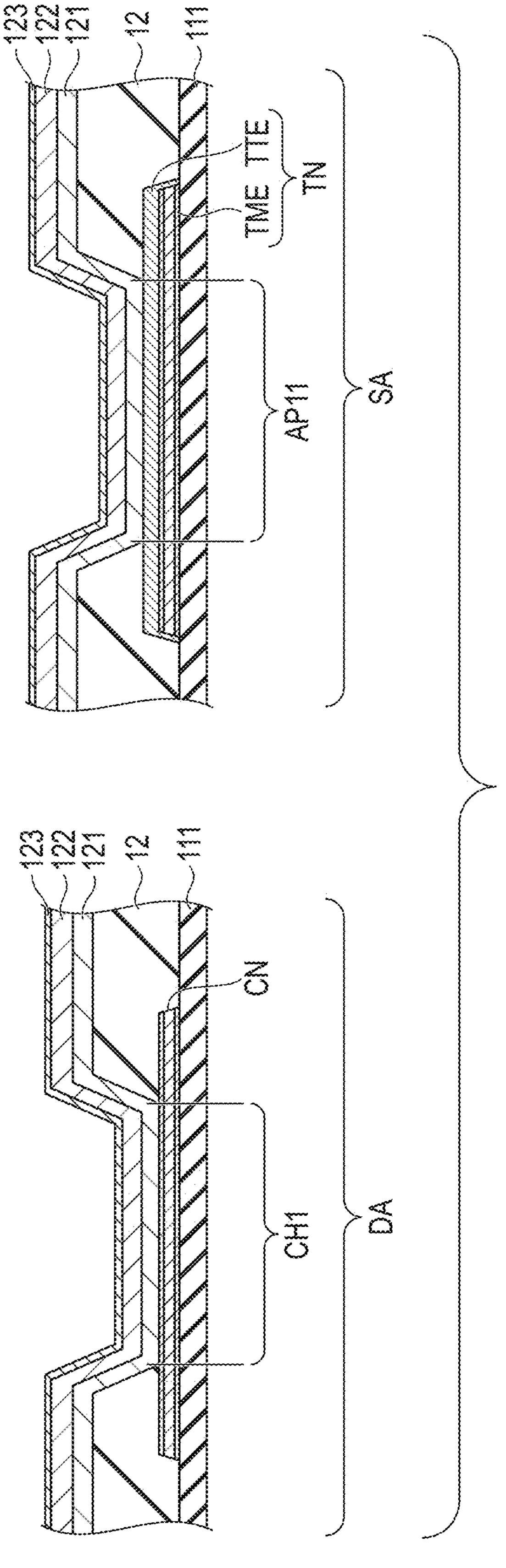
FIG. 35 is a diagram for explaining the manufacturing method of the display device DSP.

Subsequently, in step ST34, as shown in FIG. 35, the insulating layer 12 is formed. The insulating layer 12 comprises the contact hole CH1 communicating with the connection electrode CN, etc., in the display area DA and is formed so as to overlap the peripheral portion of the terminal electrode TN in the surrounding area SA. In the aperture AP11 of the insulating layer 12, the transparent electrode TTE of the terminal electrode TN is exposed.

Subsequently, over the display area DA and the surrounding area SA, the first transparent conductive layer 121 is formed, and the first metal layer 122 is formed, and the second transparent conductive layer 123 is formed. The first transparent conductive layer 121 is in contact with the connection electrode CN in the contact hole CH1 of the display area DA and is in contact with the transparent electrode TTE of the terminal electrode TN in the aperture AP11 of the surrounding area SA. For example, the first transparent conductive layer 121 and the second transparent conductive layer 123 are formed of ITO, and the first metal layer 122 is formed of silver.

Figure 36:
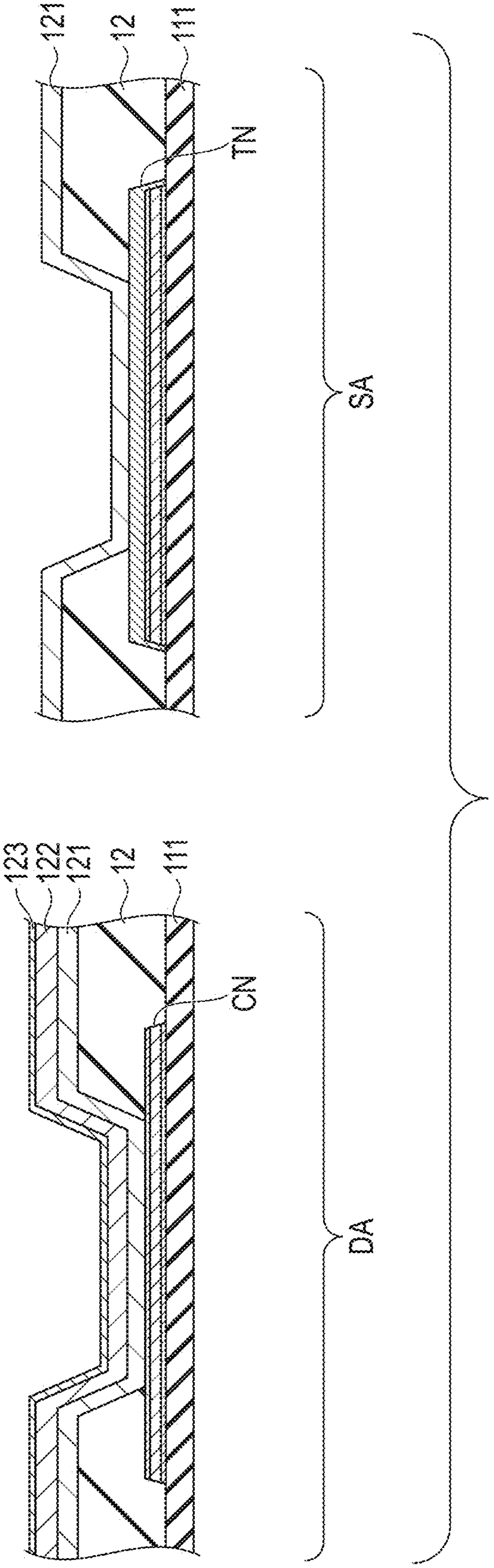
FIG. 36 is a diagram for explaining the manufacturing method of the display device DSP.

Subsequently, in step ST35, as shown in FIG. 36, the first transparent conductive layer 121 of the surrounding area SA is exposed. Step ST35 includes step ST2 explained with reference to FIG. 7, step ST3 explained with reference to FIG. 8 and step ST4 explained with reference to FIG. 9.

Figure 37:
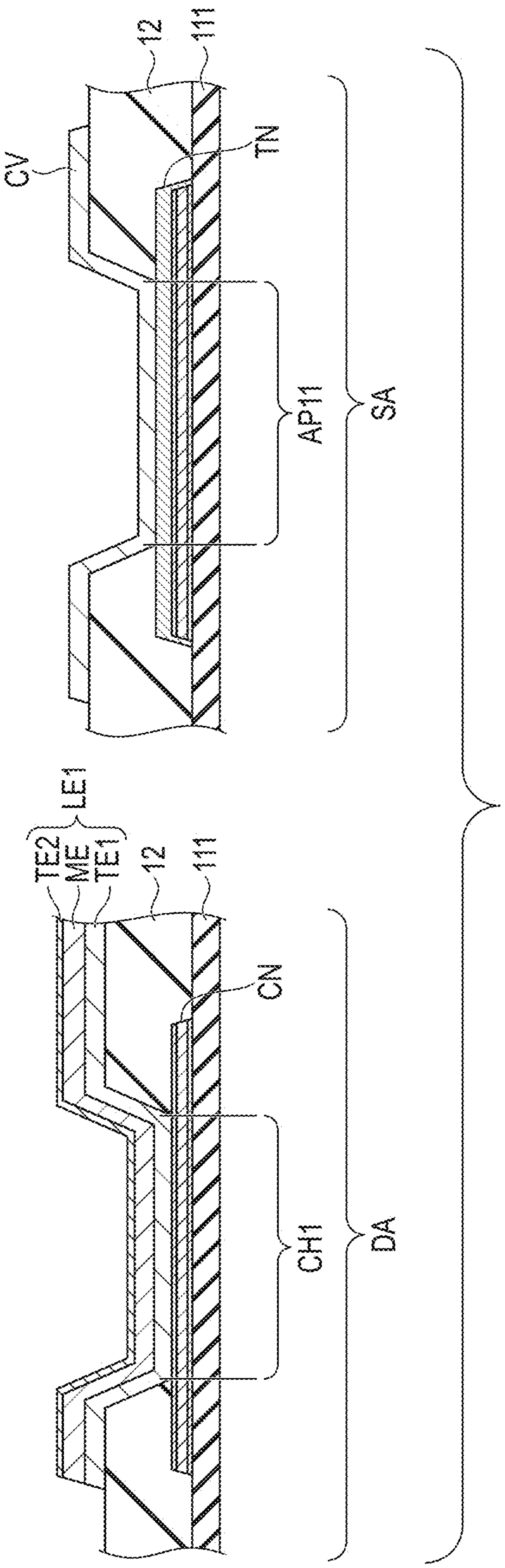
FIG. 37 is a diagram for explaining the manufacturing method of the display device DSP.

Subsequently, in step ST36, as shown in FIG. 37, the lower electrode LE1 is formed in the display area DA, and the cover electrode CV is formed in the surrounding area SA. Step ST36 includes step ST5 explained with reference to FIG. 10, step ST6 explained with reference to FIG. 11, step ST7 explained with reference to FIG. 12, step ST8 explained with reference to FIG. 13 and step ST9 explained with reference to FIG. 14.

In this manner, the lower electrode LE1 electrically connected to the connection electrode CN in the contact hole CH1 is formed in the display area DA by patterning the first transparent conductive layer 121, the first metal layer 122 and the second transparent conductive layer 123. The cover electrode CV which covers the terminal electrode TN exposed from the insulating layer 12 is formed in the surrounding area SA by patterning the first transparent conductive layer 121. Here, the process of forming the lower electrode LE1 of the display area DA is explained. At the same time as the lower electrode LE1, the lower electrode LE2 and the lower electrode LE3 are also formed.

Subsequently, step ST10 explained with reference to FIG. 15, step ST11 explained with reference to FIG. 16 and step ST12 explained with reference to FIG. 17 are performed to form the rib 5 and the partition 6.

Subsequently, the display elements 201 to 203 are formed through the processes shown in FIG. 18 to FIG. 24.

Subsequently, the resin layer 13, the sealing layer 14 and the resin layer 15 are formed in order, and the display device DSP is completed.

According to configuration example 3 described above, the terminal electrode TN of the pad PD comprises the transparent electrode TTE which covers the metal electrode TME. The transparent electrode TTE is covered with the cover electrode CV. Each of the transparent electrode TTE and the cover electrode CV is formed of a conductive oxide.

Thus, as the pad PD consists of a stacked layer body of the metal electrode TME, the transparent electrode TTE and the cover electrode CV, the strength of the pad PD can be assured when the IC chip and the flexible printed circuit are mounted on the pad PD.

Since the metal electrode TME is covered with the transparent electrode TTE in the terminal electrode TN, the oxidation or corrosion of the terminal electrode TN is prevented, thereby realizing a good electrical connection.

The cover electrode CV is formed of the same material by the same process as the transparent electrode constituting the lower electrode. Therefore, a separate process for forming the cover electrode CV is unnecessary.

Even if the thickness of the transparent electrode located as the lower layer of the lower electrode becomes thin to the extent that it is substantially equal to the thickness of the transparent electrode located as the upper layer of the lower electrode, as the terminal electrode TN comprises the transparent electrode TTE which is in contact with the cover electrode CV, the strength of the pad PD can be assured. Compared to the lower electrode of configuration example 1, the entire lower electrode can be made thinner. Thus, the film break of the rib 5 which covers the peripheral portion of the lower electrode is prevented. The connection electrode CN connected to the lower electrode is the metal electrode CME and does not include a transparent electrode. Therefore, the increase in the contact resistance between the lower electrode and the connection electrode CN is prevented.

In this manner, the reduction in reliability is prevented.

In the embodiment described above, for example, the transparent electrode TE1 corresponds to a first transparent electrode. The transparent electrode TE2 corresponds to a second transparent electrode. The metal electrode ME corresponds to a first metal electrode. The metal electrode TME of the terminal electrode TN corresponds to a second metal electrode. The transparent electrode TTE of the terminal electrode TN corresponds to a third transparent electrode. The metal electrode CME of the connection electrode CN corresponds to a third metal electrode. The transparent electrode CTE of the connection electrode CN corresponds to a fourth transparent electrode.

In the above explanation, the thin films L1 to L3 of the connection electrode CN and the thin films L11 to L13 of the terminal electrode TN are formed of titanium-based materials. However, these thin films may be formed of molybdenum-based materials.

As explained above, the present embodiment can provide a display device and a manufacturing method thereof such that the reduction in reliability can be prevented.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising:

a substrate;

a connection electrode provided in a display area which displays an image above the substrate;

a terminal electrode provided in a surrounding area located on an external side relative to the display area above the substrate;

an insulating layer which comprises a contact hole communicating with the connection electrode and overlaps a peripheral portion of the terminal electrode;

a lower electrode provided on the insulating layer and electrically connected to the connection electrode in the contact hole;

a rib formed of an inorganic insulating material and overlapping a peripheral portion of the lower electrode;

a partition which comprises a lower portion provided on the rib and formed of a conductive material and an upper portion provided on the lower portion and protruding from a side surface of the lower portion;

an organic layer provided on the lower electrode and including a light emitting layer;

an upper electrode which covers the organic layer and is in contact with the lower portion of the partition; and a cover electrode which covers the terminal electrode exposed from the insulating layer, wherein the lower electrode comprises a first transparent electrode, a first metal electrode located on the first transparent electrode, and a second transparent electrode located on the first metal electrode, and the cover electrode is formed of a same material as the first transparent electrode.

2. The display device of claim 1, wherein the terminal electrode is a second metal electrode formed of a material different from a material of the first metal electrode, and the cover electrode is in contact with the second metal electrode.

3. The display device of claim 2, wherein the second metal electrode is a multilayer body comprising a plurality of thin films formed of metal materials different from each other.

4. The display device of claim 1, wherein a thickness of the first transparent electrode is equal to a thickness of the cover electrode and is greater than a thickness of the second transparent electrode.

5. The display device of claim 1, wherein the terminal electrode comprises a second metal electrode formed of a material different from a material of the first metal electrode, and a third transparent electrode located on the second metal electrode, and the cover electrode is in contact with the third transparent electrode.

6. The display device of claim 5, wherein the connection electrode comprises a third metal electrode formed of a same material as the second metal electrode, and a fourth transparent electrode located on the third metal electrode, and the first transparent electrode is in contact with the fourth transparent electrode in the contact hole.

7. The display device of claim 5, wherein the connection electrode is a third metal electrode formed of a same material as the second metal electrode, and the first transparent electrode is in contact with the third metal electrode in the contact hole.

8. The display device of claim 1, wherein each of the first transparent electrode, the second transparent electrode and the cover electrode is formed of indium tin oxide (ITO), and the first metal electrode is formed of silver (Ag).

* * * * *